US008233320B2

(12) United States Patent
Lee et al.

(10) Patent No.: US 8,233,320 B2
(45) Date of Patent: Jul. 31, 2012

(54) HIGH SPEED HIGH DENSITY NAND-BASED 2T-NOR FLASH MEMORY DESIGN

(75) Inventors: Peter Wung Lee, Saratoga, CA (US); Fu-Chang Hsu, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 214 days.

(21) Appl. No.: 12/829,391

(22) Filed: Jul. 2, 2010

(65) Prior Publication Data
US 2011/0157982 A1  Jun. 30, 2011

Related U.S. Application Data

(60) Provisional application No. 61/270,583, filed on Jul. 10, 2009.

(51) Int. Cl.
*G11C 16/04* (2006.01)
(52) U.S. Cl. .......... 365/185.03; 365/185.12; 365/185.18
(58) Field of Classification Search .................. None
See application file for complete search history.

(56) References Cited

U.S. PATENT DOCUMENTS

| 6,614,691 B2* | 9/2003 | Roohparvar ............ 365/185.23 |
| 2002/0186591 A1* | 12/2002 | Lee et al. ................ 365/185.17 |
| 2004/0027856 A1* | 2/2004 | Lee et al. ................ 365/185.11 |

* cited by examiner

*Primary Examiner* — Huan Hoang
*Assistant Examiner* — James G Norman
(74) *Attorney, Agent, or Firm* — Lin & Associates IP, Inc.

(57) ABSTRACT

A two transistor NOR flash memory cell has symmetrical source and drain structure manufactured by a NAND-based manufacturing process. The flash cell comprises a storage transistor made of a double-poly NMOS floating gate transistor and an access transistor made of a double-poly NMOS floating gate transistor, a poly1 NMOS transistor with poly1 and poly2 being shorted or a single-poly poly1 or poly2 NMOS transistor. The flash cell is programmed and erased by using a Fowler-Nordheim channel tunneling scheme. A NAND-based flash memory device includes an array of the flash cells arranged with parallel bit lines and source lines that are perpendicular to word lines. Write-row-decoder and read-row-decoder are designed for the flash memory device to provide appropriate voltages for the flash memory array in pre-program with verify, erase with verify, program and read operations in the unit of page, block, sector or chip.

30 Claims, 27 Drawing Sheets

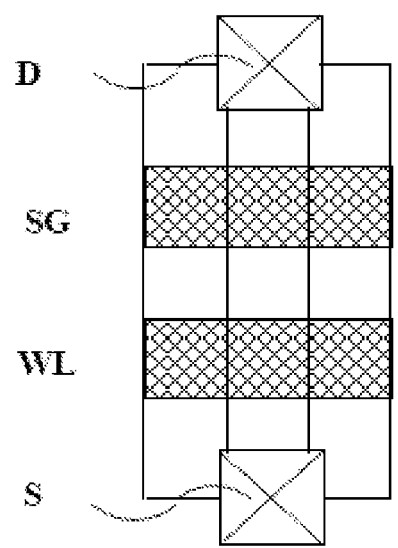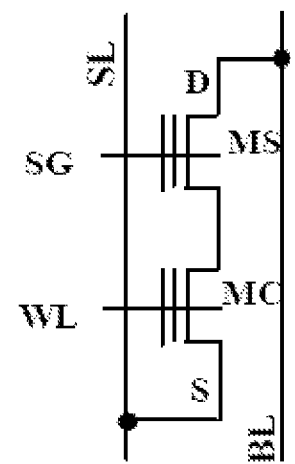
FIG. 1A  FIG. 1B
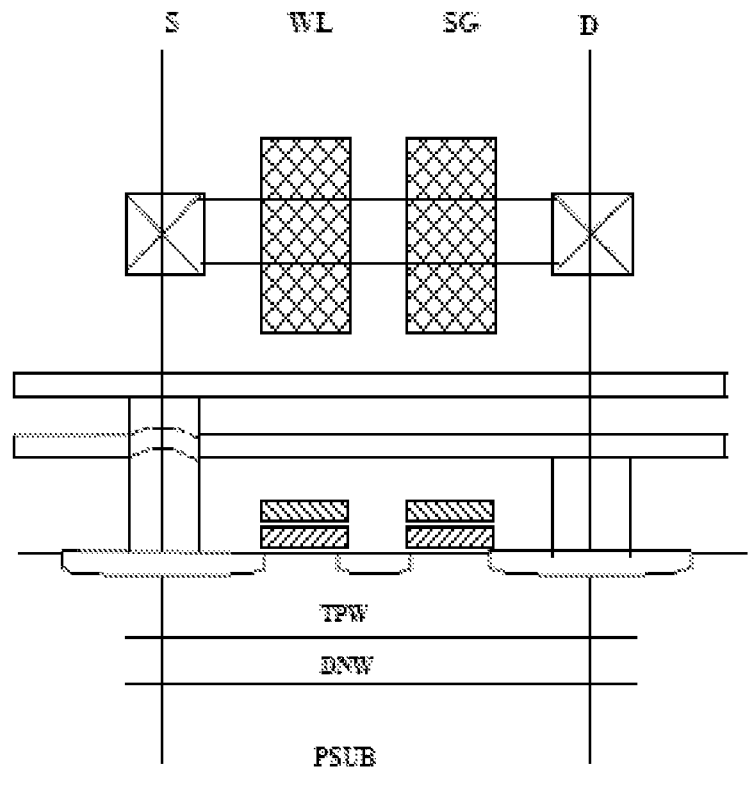
FIG. 1C

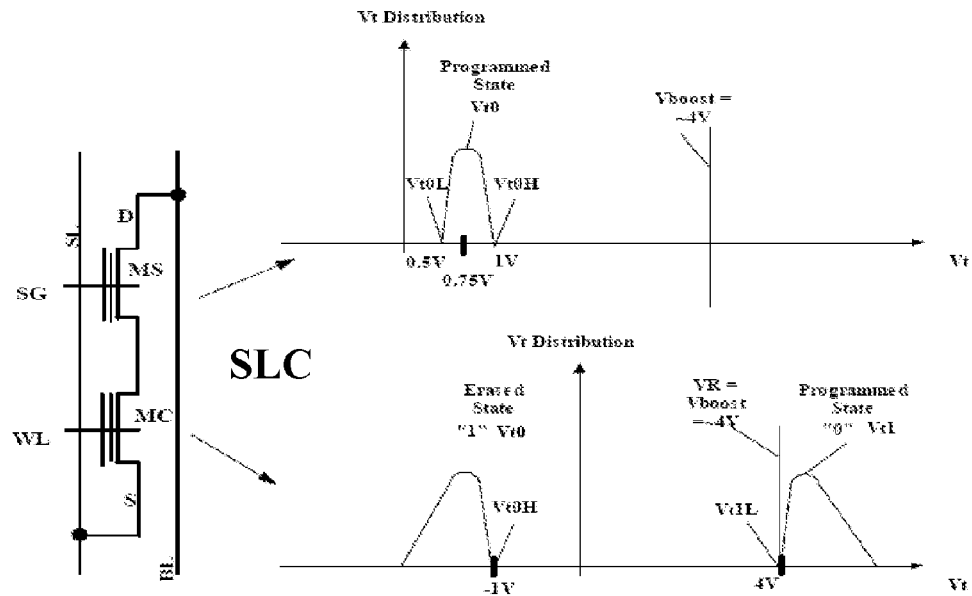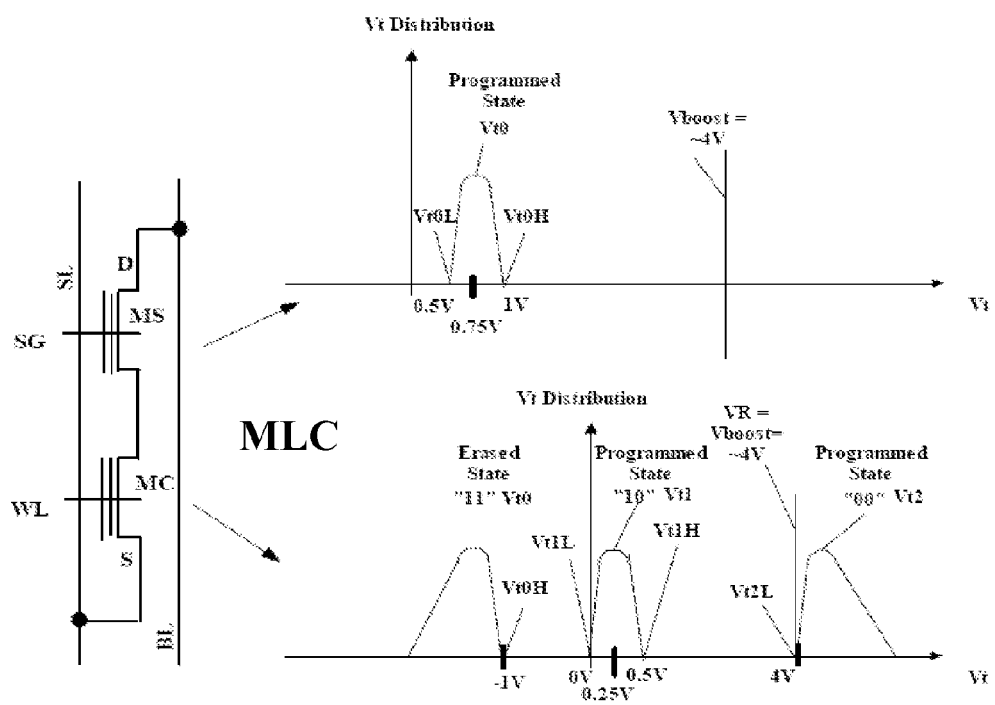
FIG. 1D

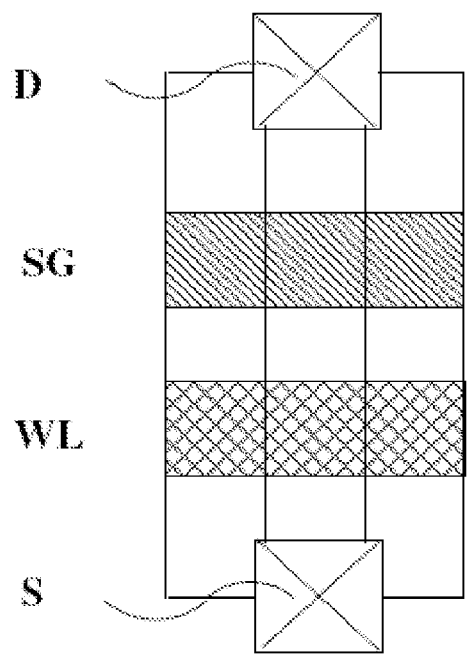
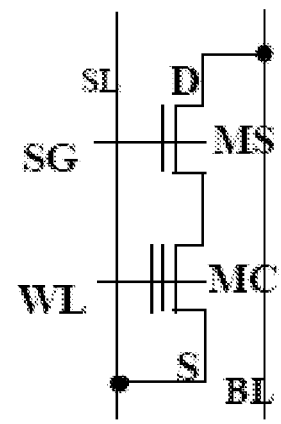
FIG. 3A  FIG. 3B
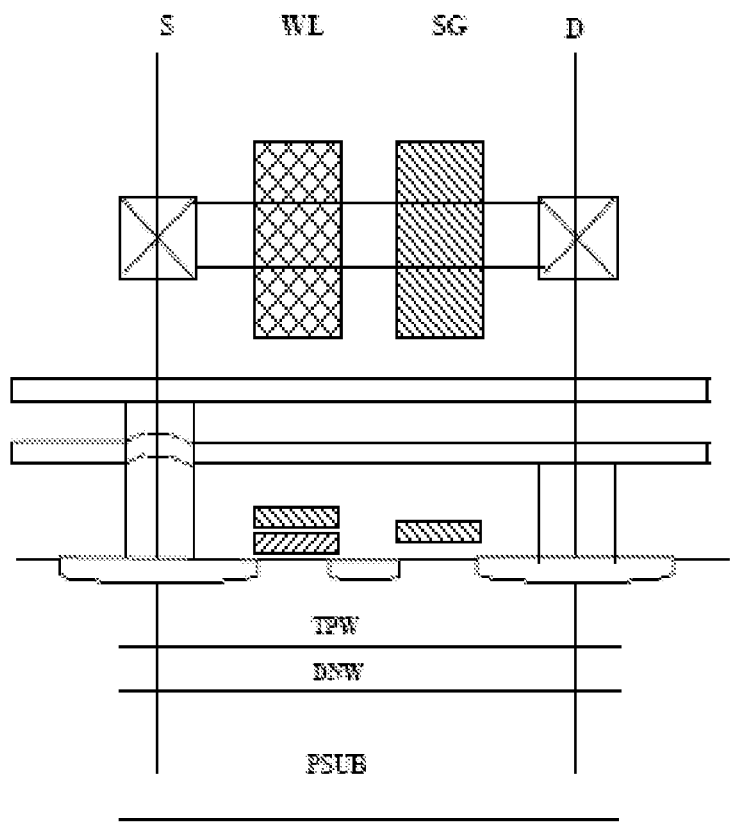
FIG. 3C

| Mode \ Voltage | SEL Sector | | | | | | | | | | |
|---|---|---|---|---|---|---|---|---|---|---|---|
| | SG | | WL | | BL | SL | BLG | | SLG | | TPW |
| | Sel | Un-sel | Sel | Un-sel | | | Sel | Un-sel | Sel | Un-sel | |
| Page PreProgram | 0V | 0V | 20V | 0V | 0V | 0V | Vdd | Vdd | Vdd | Vdd | 0V |
| Page Pre-Program Verify | Vdd | 0V | Vt1L (Vt2L) | 0V | Vdd-Vt /0V | 0V | Vdd | Vdd | Vdd | Vdd | 0V |
| Block Pre-Program | 0V | 0V | 20V | 0V | 0V | 0V | Vdd | Vdd | Vdd | Vdd | 0V |
| Block Pre-Program Verify | Vdd | 0V | Vt1L (Vt2L) | 0V | Vdd-Vt /0V | 0V | Vdd | Vdd | Vdd | Vdd | 0V |
| Sector/Chip Pre-Program | 0V | NA | 20V''' | NA | 0V | 0V | Vdd | Vdd | Vdd | Vdd | 0V |
| Sector/Chip Pre-Program Verify | Vdd | NA | Vt1L (Vt2L) | NA | Vdd-Vt /0V | 0V | Vdd | Vdd | Vdd | Vdd | 0V |

Vt1L (Vt2L) : SLC(2 states) or MLC (3 states)
20V''': Selected Sector's WL is 20V
Unselected Sector's WL is 0V

FIG. 9

| | SEL Sector | | | | | | | | | | |
|---|---|---|---|---|---|---|---|---|---|---|---|
| Voltage \ Mode | SG | | WL | | BL | SL | BLG | | SLG | | TPW |
| | Sel | Un-sel | Sel | Un-sel | | | Sel | Un-sel | Sel | Un-sel | |
| Page Erase | 20V* | 20V* | 0V | 20V* | 20V^ | 20V^ | Vdd | Vdd | Vdd | Vdd | 20V |
| Page Erase Verify | Vdd | 0V | 0V | 0V | 1V /0V | 1V | Vdd | 0V | Vdd | 0V | 0V |
| Block Erase | 20V* | 20V* | 0V | 20V* | 20V^ | 20V^ | Vdd | Vdd | Vdd | Vdd | 20V |
| Sector/Chip Erase | 20V* | NA | 0V | NA | 20V^ | 20V^ | Vdd | Vdd | Vdd | Vdd | 20V''' |

20V*: Coupled from Array's TPW
20V^: Forwarded from Array's TPW
20V''': Selected Sector's TPW is 20V
    Unselected Sector's TPW is 0V

FIG. 10

| SEL Sector | | | | | | | | | | | |
|---|---|---|---|---|---|---|---|---|---|---|---|
| Voltage \ Mode | SG | | WL | | BL | SL | BLG | | SLG | | TPW |
| | Sel | Un-sel | Sel | Un-sel | | | Sel | Un-sel | Sel | Un-sel | |
| Page Program | 5V | 5V | 15V -20V | 5V | 0V/ ~8V | 0V/ ~8V | 10V | 0V | 10V | 0V | 0V |
| Page Program Verify | Vdd | 0V | Vt1L! (Vt2L) | 0V | Vdd-Vt /0V | 0V | Vdd | 0V | Vdd | 0V | 0V |

Vt1L! (Vt2L) : SLC(2 states) or MLC (3 states)

FIG. 11

| SEL Sector | | | | | | | | | | | |
|---|---|---|---|---|---|---|---|---|---|---|---|
| Voltage \ Mode | SG | | WL | | BL | SL | BLG | | SLG | | TPW |
| | Sel | Un-sel | Sel | Un-sel | | | Sel | Un-sel | Sel | Un-sel | |
| Read | Vboost | 0V | Vdd/ Vboost | Vdd/ Vboost | 1V | 0V | Vdd | 0V | Vdd | 0V | 0V |

Vdd = 1.6V-1.8V or 2.7V-3.6V
Vboost = 4V

FIG. 12

HIGH SPEED HIGH DENSITY NAND-BASED 2T-NOR FLASH MEMORY DESIGN

This application claims the benefit of priority to U.S. Provisional Patent Application Ser. No. 61/270,583, filed Jul. 10, 2009, which is incorporated herein by reference in its entirety.

CROSS REFERENCES TO RELATED APPLICATIONS

This application is related to U.S. patent application Ser. No. 12/387,771, filed on May 7, 2009 and Ser. No. 12/455,936, filed on Jun. 9, 2009, assigned to the same assignee as the present invention, and incorporated herein by reference in the entirety.

FIELD OF THE INVENTION

This invention relates generally to a single-chip low-voltage and high read speed nonvolatile memory (NVM), and more specifically to the design of a two transistor NOR (2T-NOR) flash memory by using NAND-based cell structure, cell operation schemes and manufacturing process.

BACKGROUND OF THE INVENTION

Nonvolatile memory is well known in the art. The different types of nonvolatile memory include read-only-memory (ROM), electrically programmable read only memory (EPROM), electrically erasable programmable read only memory (EEPROM), NOR flash memory, and NAND flash memory. In current applications such as personal digital assistants, cellular telephones, notebook and laptop computers, voice recorders, global positioning systems, etc., the flash memory has become one of the more popular types of nonvolatile memory. Flash memory has the combined advantages of the high density, small silicon area, and low cost and can be repeatedly programmed and erased with a single low-voltage power supply voltage source.

The NAND and NOR flash memory cell structures use one charge retaining (charge storage or charge trapping) transistor memory cell for storing one bit of data as charge. The storage cell with one bit data is commonly referred to as a single-level cell (SLC). They are respectively referred to as one-bit/one transistor (1b/1T) NAND cell or NOR cell, storing a single-level programmed data in the cell. In addition to storing data as a single-level program cell having two voltage thresholds ($Vt0$ and $Vt1$), both 1T NAND and NOR flash memory cells are capable of storing at least two bits per cell or two bits/one transistor (2b/1T) with four multi-level threshold voltages ($Vt0$, $Vt1$, $Vt2$ and $Vt3$) in one physical cell. The storage cell with the multi-level threshold voltages of the one transistor NAND or NOR flash memory cells is referred to as a multiple level cell (MLC).

Currently, the highest-density of a single-chip double polycrystalline silicon gate NAND flash memory chip is 64 Gb. In contrast, a double polycrystalline silicon gate NOR flash memory chip has a density of 2 Gb. The big gap between NAND and NOR flash memory densities is a result of the superior scalability of a NAND flash memory cell over a NOR flash memory cell. A NOR flash memory cell requires 5.0V drain-to-source (Vds) to maintain a high-current Channel-Hot-Electron (CHE) injection programming process. Due to this CHE scheme, the cell's channel length is very difficult to be scaled down. Alternately, a NAND flash memory cell requires 0V between the drain to the source for a low-current Fowler-Nordheim (FN) channel tunneling program process. The above results in the one-bit/one transistor NAND flash memory cell size being only one half that of a one-bit/one transistor NOR flash memory cell, and therefore higher memory density. As a result, it is always desirable to use the NAND process to manufacture NOR flash memory.

U.S. Pat. No. 6,212,102 of Infineon discloses a two transistor (2T) NOR flash memory. In the flash memory, a high voltage is also required across the drain and source region during FN-edge programming, and therefore a longer channel length is needed to prevent the punch through effect. This causes a physical limitation on how small the cell can be made and in turn limits the use of the cell in ultra high integrated levels of the flash memory below 0.18 um technology. Furthermore, the negative FN-edge programming causes device oxide degradation because the electron-hole pairs at the biased drain to triple P-well (TPW) junction are accelerated by the voltage difference between the drain and the source. The more holes are trapped in the tunneling oxide and the less program and erase endurance cycles can be achieved.

U.S. Pat. Nos. 6,307,781 and 6,628,544 of Infineon provide some improvement over the previous NOR flash memory with uniform channel erase and channel program operations by connecting the common source together in the array of the flash memory. With the connected common source, the gate of the access device has to be applied with the most negative voltage, e.g. −3V, to turn off the path to different bit lines through the common source line. Because of this biased condition during program operation, the program inhibit voltage, i.e., 3V-4V is supposed to isolate the access device. However, the drain induced leakage current may occur if the channel length is scaled down in the cell. Therefore, the flash memory still encounters the scaling issue and ends up with a large memory cell size.

In another NOR flash memory, U.S. Pat. No. 6,980,472 of Philips, both source injection program and FN channel program are disclosed. For the FN channel program, it is similar to the one used in Infineon's patent. The channel length of the access device can not be shortened because of the drain induced leakage current to the common source line when the program inhibit voltage is applied across the drain and the source. Similarly, for the source injection program scheme, the access device needs longer channel length to prevent the punch through effect. In addition, compared to FN channel program, it needs more program current because of the hot-electron generation.

SUMMARY OF THE INVENTION

This invention is designed to overcome the above-mentioned drawbacks in the conventional 2T-NOR flash memory by providing a novel symmetrical 2T-NOR flash memory based on 2-poly floating-gate NAND cell structure and process. Each 2T-NOR flash cell in the flash memory has a storage transistor coupled in series with an access transistor manufactured by using the NAND-based manufacturing process.

The NAND-based 2T-NOR flash cell can accommodate the capability of an SLC for two states or an MLC up to three states for high density flash memories used in high read speed applications. The program and erase operations are performed by using the Fowler-Nordheim scheme on the tunnel oxide layer which lies between the poly1 floating-gate storage layer and the channel on the P-substrate of the flash cell. There is no voltage difference between the drain and source of the NAND-based 2T-NOR flash cell in erase and program operations.

In a first embodiment of the present invention, both the access transistor and storage transistor of the 2T-NOR flash cell are made of identical double poly NMOS floating gate devices. The threshold voltage of the access transistor can be bit-by-bit programmed to the desired value, e.g. 0.75V or other appropriate values.

In a second embodiment, the access transistor has its poly1 and poly2 shorted and strapped to form an access line of poly1-transistor that connects a row of access transistors of the flash memory. The threshold voltage of the access transistor in the second embodiment is the threshold voltage of the poly1 NMOS transistor. In a third embodiment, the access transistor is made of an either poly1 or poly2 NMOS transistor. The threshold voltage of the access transistor in the third embodiment is the threshold voltage of the poly1 or poly2 NMOS transistor.

In contrast to the conventional flash memory in which source lines are formed vertically to bit lines, the bit lines and source lines of the 2T-NOR flash cells are made by metal lines of different layers in parallel. In addition, a paired separate source line and bit line are used to form each column of the memory array of the 2T-NOR flash memory. There is no common source line shared by different columns of the memory array.

In accordance with the present invention, the NAND-based 2T NOR flash memory comprises a memory array, a write-row-decoder, a read-row-decoder, a data buffer and slow speed page sense amplifier unit, an isolate device unit, a low voltage (LV) Y-pass gate and Y-decoder unit, and a byte/word high speed sense amplifier unit. The read-row-decoder is fast booted and dedicated to the gates of the access transistors which are switched according to the decoding output. The write-row-decoder is implemented for both access transistors and storage transistors. The isolate device unit is used to isolate the memory array from the LV Y-pass of the LV Y-pass gate and Y-decoder when erase or program operations are performed.

The read-row-decoder of the present invention is made of a medium-high voltage device for the boosted voltage to operate at around 4.0V during fast random reading. There are two high voltage (HV) enhancement NMOS devices for isolation between the write-row-decoder and read-row-decoder for the access transistors. Both HV NMOS devices separate the write-row-decoder and the read-row-decoder. The capability of coupling voltage from the triple P-well of the flash cell can be obtained by turning off those two HV NMOS devices during erasing. By using the read-row-decoder through the isolation HV NMOS device to connect the select gates of access transistors, high driving capability is provided to achieve high speed requirement in some embedded applications.

The invention uses the access transistor to overcome the over-erase issue commonly seen in the 1T-NOR flash memory. It simplifies the design of the on-chip state machine. A preferred voltage for the unselected word lines is provided for a channel program operation so that the disturbance of the Vt of the unselected cells can be eliminated or substantially reduced. In addition, the invention uses 3-state MLC design for high speed applications during reading. A fixed preferred word line (WL) voltage level and a low enough memory cell Vt provide high enough cell current. It offers ultra-high density, low cost and high speed solution for the flash memory in embedded applications.

For high speed embedded applications, the present invention offers two approaches to enhancing the memory cell current during reading. For applications requiring low power, the first approach applies Vdd (1.8V or 3V) level to all the storage transistors. Therefore, there is no need of boosted WL due to the relatively high enough cell current with the negative Vt for the erased-state storage device. However, there is always a need of boosted voltage, e.g. 4V, for the access device because its Vt is around 0.75V. The second approach replaces Vdd level by the boosted voltage. Compared to the first approach, the latter one has the lowest resistance while reading. It provides high speed performance with relatively high power because the gate voltage of both storage device and access device comes from the same boosted voltage source.

In the flash cell of the prior arts, the negative FN-edge program causes device oxide degradation because the electron-hole pairs at the biased drain and TPW junction are accelerated by the voltage difference between drain and source, and endurance cycles are gradually reduced as more holes are trapped. Because there is no voltage difference between the drain and the source of the flash cell, significant improvement has been made in the present invention over the prior arts in endurance cycles for both program and erase operations.

Furthermore, no gate disturbance can occur in page, block, sector and chip erase operations of the present invention because there is no voltage difference between the unselected WLs and TPW, and less disturbance is introduced in the program operation because the bit line (BL) inhibit voltage is almost half of the programmed WL voltage and the unselected WL voltage is almost half of the BL inhibit voltage.

The foregoing and other features, aspects and advantages of the present invention will become better understood from a careful reading of a detailed description provided herein below with appropriate reference to the accompanying drawings.

BRIEF DESCRIPTION OF THE DRAWINGS

FIG. 1A is a top view of the plan layout of a NAND-based 2-poly floating-gate NMOS 2T-NOR flash cell according to the first embodiment of the present invention in which both MS and MC cells are 2-poly floating-gate NAND cells.

FIG. 1B is a schematic diagram of the circuit of the NAND-based 2-poly floating-gate NMOS 2T-NOR flash cell according to the first embodiment of the present invention.

FIG. 1C is a cross sectional view of the NAND-based 2-poly floating-gate NMOS 2T-NOR flash cell according to the first embodiment of the present invention.

FIG. 1D shows the voltage distributions of the SLC and MLC of the NAND-based floating-gate NMOS 2T-NOR flash cell according to the first embodiment of the present invention.

FIG. 3A is a top view of the plan layout of a NAND-based floating-gate NMOS 2T-NOR according to the third embodiment of the present invention in which MC is a 2-poly floating-gate NAND cell and MS is a poly1 or poly2 transistor.

FIG. 3B is a schematic diagram of the circuit of the NAND-based floating-gate NMOS 2T-NOR flash cell according to the third embodiment of the present invention.

FIG. 3C is a cross sectional view of the NAND-based floating-gate NMOS 2T-NOR flash cell according to the third embodiment of the present invention.

FIG. 9 shows a table illustrating the biased voltages of the NAND-based 2T-NOR flash memory array in a pre-program operation for the flash cells in one selected sector of the present invention.

FIG. 10 shows a table illustrating the biased voltages of the NAND-based 2T-NOR flash memory array in an erase operation for the flash cells in one selected sector of the present invention.

FIG. 11 shows a table illustrating the biased voltages of the NAND-based 2T-NOR flash memory array in a program operation for the flash cells in one selected sector of the present invention.

FIG. 12 shows a table illustrating the biased voltages of the NAND-based 2T-NOR flash memory array in a read operation for the flash cells in one selected sector of the present invention.

DETAILED DESCRIPTION OF THE EMBODIMENTS

Figure 2:
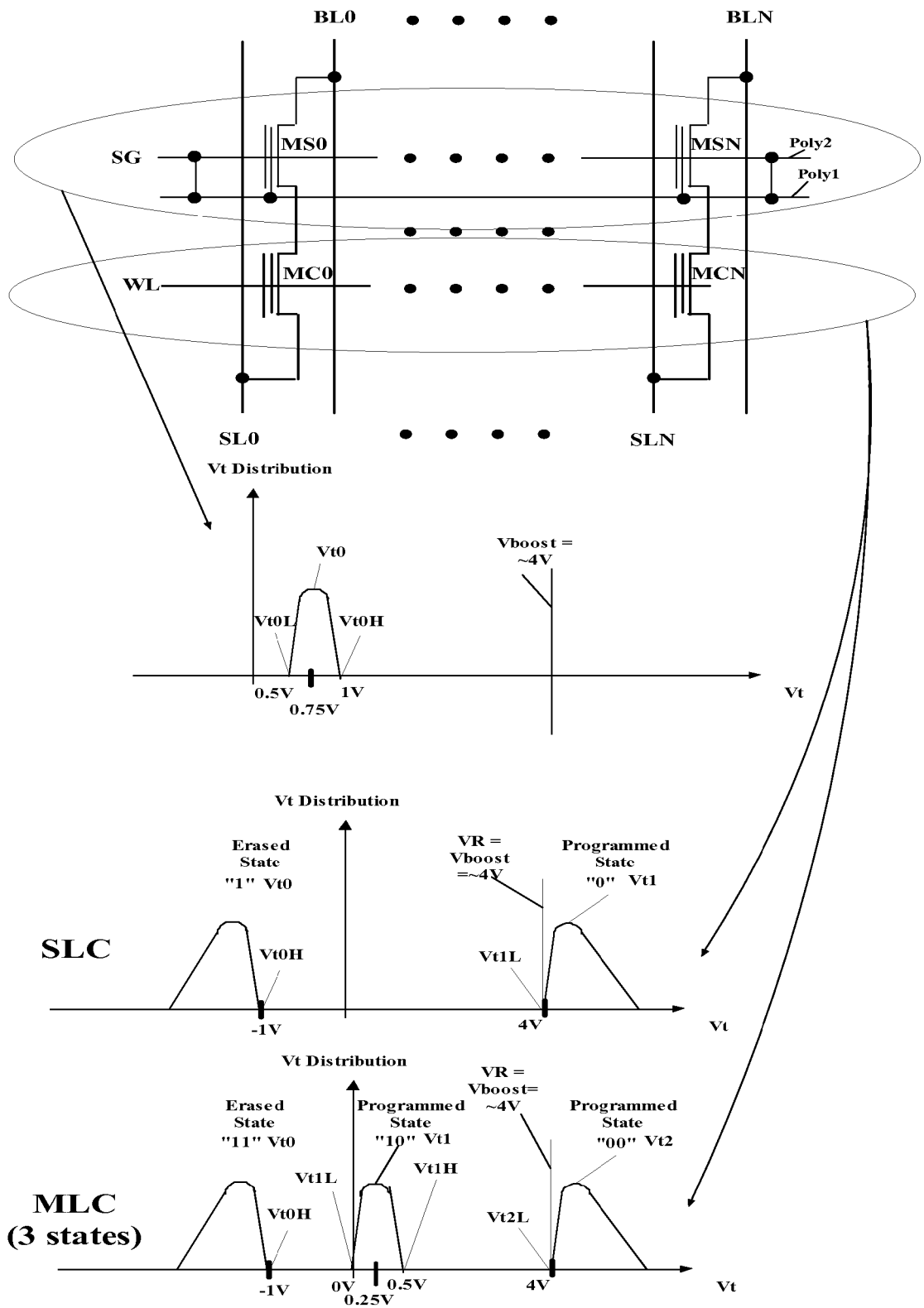
FIG. 2 shows the circuit diagram of a NAND-based 2T-NOR flash cell and the threshold voltage distributions of the corresponding SLC and MLC according to the second embodiment of the present invention in which MC is a 2-poly floating-gate NAND cell while MS is a poly1 transistor with shorted poly1 and poly2.

FIG. 1A is a top view of the plan layout of a floating-gate type NMOS, NAND-based 2T-NOR flash cell of the first embodiment in the present invention. The figure only shows four key connection nodes of the drain (N-active), source (N-active), select gate for accessing the device, and the cell gate of the storage device in the flash cell and they are denoted as D, S, SG and WL respectively. The S node has a half contact for a source line connection and the D node has a half for a bit line connection.

FIG. 1B shows a schematic diagram for the circuit of the NAND-based 2T-NOR flash cell according to FIG. 1A of the present invention. The access transistor MS and the storage transistor MC are both made of a 2-poly floating-gate cell. The circuit of the 2T-NOR flash cell has four terminals for D, SG, WL and S. The D node is connected to a local vertical metal bit line denoted as BL and the S node is connected to a local vertical metal source line denoted as SL. In contrast to the conventional 2T-NOR flash array, each 2T-NOR flash cell string of the present invention has two dedicated metal lines BL and SL which are preferred to run vertically in Y-direction perpendicular to the horizontal word lines running in X-direction. The present invention does not have common source lines that are widely used in many conventional 2T-NOR flash memory devices.

FIG. 1C shows a cross-sectional view of the NAND-based 2T-NOR flash cell according to FIG. 1A. Both floating-gate gates of MS and MC are made of a poly1 conduction layer right underneath the poly2 gate. The two gates SG and WL are poly2 gates. SG is the poly2 gate of the 2-poly access transistor MS and WL is the poly2 gate of the other 2-poly storage transistor of MC. The other three layers of the flash cell include TPW (triple P-well), DNW (deep N-well) and PSUB (P-substrate). All seven nodes D, SG, WL, S, TPW, DNW and PSUB of a single 2T-NOR flash cell have to be coupled with appropriate bias conditions in the circuit for respective operations. The poly1 node is a floating-node and therefore it has no external terminal for circuit connection. Poly1 is not accessible from the circuit.

FIG. 1D shows Vt distributions for the storage transistor MC and access transistor MS for both SLC and MLC of the NAND-based 2T-NOR flash cell according to FIG. 1A. For the access transistor MS, the threshold voltage Vt can be bit-by-bit programmed to a tightened distribution. This Vt0 is set with a preferred center value of +0.75V, ranging from +0.5V to +1V in accordance with the present invention. For the storage transistor MC, the two state SLC Vt distribution shows the erased state (<Vt0H=−1V) and the programmed state (>Vt1L=4V). The Vt ranges of both states can be widely spread without concern of over-erase or over-program.

During SLC reading, the gate voltage $V_{SG}$ of MS is set to Vboost for the selected 2T-NOR flash cell, but is set to 0V for the unselected 2T-NOR flash cells to block any leakage for an accurate reading. The preferred voltage for Vboost is about 4V which is higher than Vt0H (1V) of the access transistor MS by 3V. Meanwhile, for the storage transistor MC, the gate voltage $V_{WL}$ of MC is set to Vdd or Vboost. Because a power supply voltage Vdd may be 1.6V-1.8V or 2.7V-3.6V, the preferred voltage for $V_{WL}$ is Vboost in the former case and Vdd in the latter case. In both cases, low series resistance with high enough current can be achieved when the 2T-NOR flash cell is applied to high speed applications.

In the MLC case, the Vt distribution of the access transistor MS is identical to that of the SLC case. For the storage transistor MC, the three state MLC Vt distribution in FIG. 1D shows the erased state (<Vt0H=−1V), the first programmed state (>Vt1L=0V; <Vt1H=0.5V) and the second programmed state (>Vt2L=4V). The Vt range of the erased state and the second program state can be widely spread without concern of over-erase or over-program. However, the first program state should be bit-by-bit programmed to a tightened distribution.

During MLC reading, the gate voltage $V_{SG}$ of MS is set to Vboost for the selected 2T-NOR flash cell, but is set to 0V for the unselected 2T-NOR flash cells to block any leakage for an accurate reading. The preferred voltage for Vboost is about 4V which is higher than Vt0H (1V) of the access transistor MS by 3V. Meanwhile, for the storage transistor MC, the gate voltage of $V_{WL}$ of MC is set to Vboost too. As a result, once the erased state and the first programmed state can be well controlled to the targeted values, the desired high cell current can be obtained and the high speed performance can be achieved as well.

FIG. 2 shows the circuit diagram of a NAND-based 2T-NOR flash cell according to the second embodiment of the present invention and the threshold voltage distributions of the corresponding SLC and MLC. In this embodiment, the storage transistor MC is a 2-poly floating-gate NAND cell while the access transistor MS is a poly1 transistor made of a double poly NMOS device with poly1 and poly2 shorted and strapped to form an access line to connect a row of access transistors. For the access transistor MS, the threshold voltage Vt is the threshold voltage of the poly1 NMOS transistor. This Vt0 is set with a preferred center value of +0.75V, ranging from +0.5V to +1V in accordance with the present invention.

For the storage transistor MC, the Vt distribution of two state SLC shows the erased state (<Vt0H=−1V) and the programmed state (>Vt1L=4V). The Vt ranges of both states can be widely spread without concern of over-erase or over-program. The Vt distribution of the three state MLC in FIG. 2 shows the erased state (<Vt0H=−1V), the first programmed state (>Vt1L=0V; <Vt1H=0.5V) and the second programmed state (>Vt2L=4V). The Vt range of the erased state and the second program state can also be widely spread without concern of over-erase or over-program. However, the first program state should be bit-by-bit programmed to a tightened distribution. During SLC or MLC reading, the gate voltage $V_{SG}$ of MS is set to Vboost for the selected 2T-NOR flash cell, but is set to 0V for the unselected 2T-NOR flash cells to block any leakage for an accurate reading. The preferred voltage for Vboost is about 4V which is higher than Vt0H (1V) of the access transistor MS by 3V. It can achieve low resistance with high enough current when the 2T-NOR flash cell is applied to the high speed applications.

FIG. 3A is a top view of the plan layout of a floating-gate type NMOS, NAND-based 2T-NOR flash cell of the third embodiment in the present invention. Only four key connection nodes of drain (N-active), source (N-active), select gate for accessing the device, and the cell gate of the storage device are shown and they are denoted as D, S, SG and WL respectively. The S node has a half contact for a source line connection and the D node has a half for a bit line connection.

FIG. 3B shows a schematic diagram for the circuit of the NAND-based 2T-NOR flash cell according to FIG. 3A of the present invention. The access transistor MS is made of an either poly1 or poly2 NMOS device dependent on which manufacturing process is appropriate for application. The flash storage transistor MC is still made of a 2-poly floating-gate cell. The circuit of the 2T-NOR flash cell has four terminals for D, SG, WL and S. The D node is connected to a local vertical metal bit line denoted as BL and the S node is connected to a local vertical metal source line denoted as SL. Similar to the first and second embodiments of the present invention and in contrast to the conventional 2T-NOR flash array connection, each 2T-NOR flash cell string of the third embodiment has two dedicated metal lines BL and SL which are preferred to run vertically in Y-direction perpendicular to the horizontal word lines running in X-direction. The third embodiment does not have common source lines either.

FIG. 3C shows a cross-sectional view of the NAND-based 2T-NOR flash cell according to FIG. 3A. The floating gate of MC is made of a poly1 conduction layer right underneath the poly2 gate. WL is the poly2 gate of the 2-poly storage transistor of MC. The poly gate SG of the access transistor MS is made of either poly1 or poly2 NMOS transistor. The other three layers of the flash cell include TPW, DNW and PSUB. All seven nodes D, SG, WL, S, TPW, DNW and PSUB of a single 2T-NOR flash have to be coupled with appropriate bias conditions in the circuit for respective operations. The poly1 node is a floating-node and therefore it has no external terminal for circuit connection. Poly1 is not accessible from the circuit.

Figure 3D:
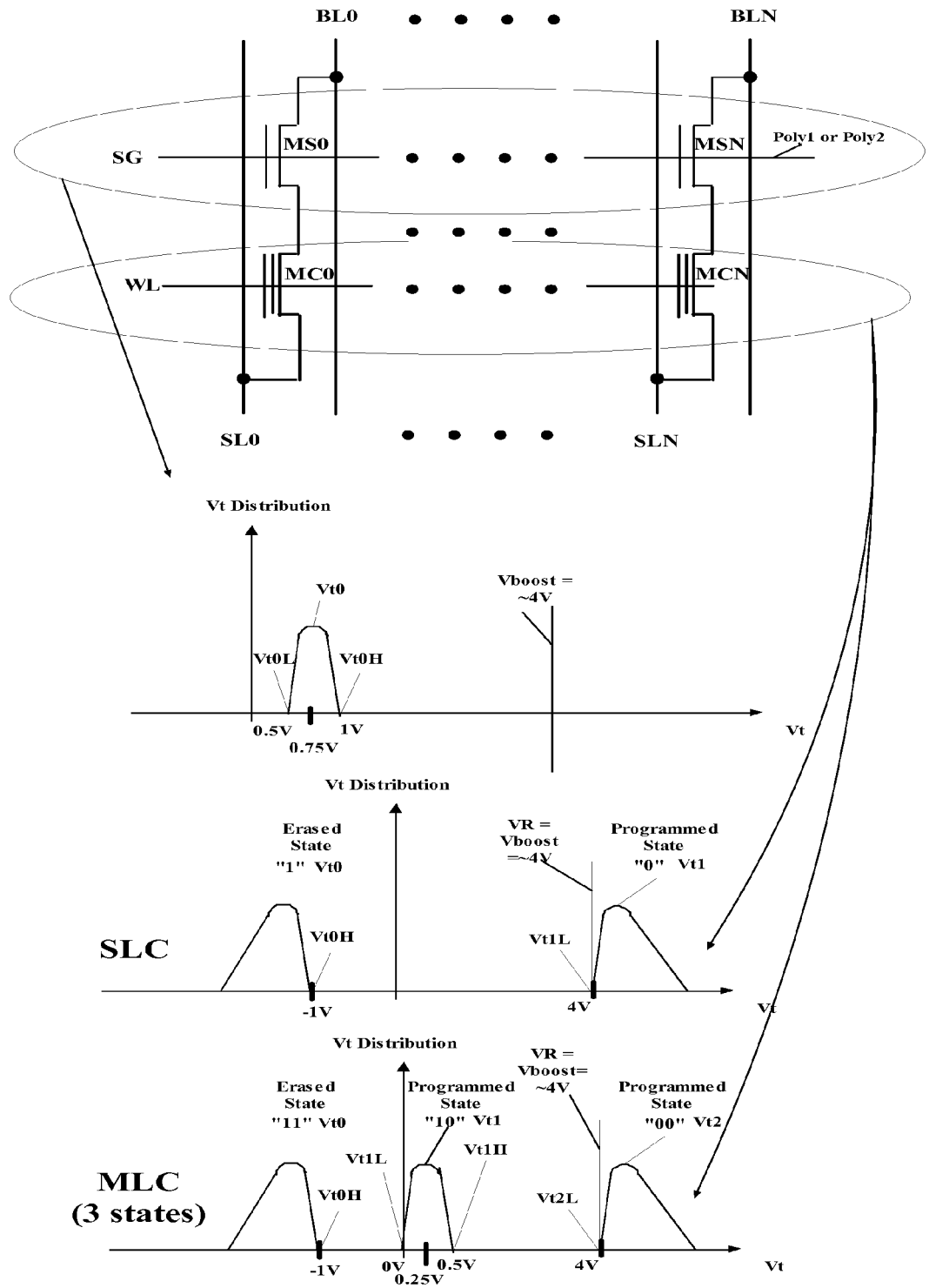
FIG. 3D shows the circuit diagram of the NAND-based 2T-NOR flash cell and the threshold voltage distributions of the corresponding SLC and MLC according to the third embodiment of the present invention.

FIG. 3D shows Vt distributions for the storage transistor MC and access transistor MS for both SLC and MLC of the NAND-based 2T-NOR flash cell according to the third embodiment. For the access transistor MS in this embodiment, the threshold Vt is the threshold voltage of the poly1 or poly 2 transistor because the access transistor MS is made of the poly1 or poly2 layer. The Vt distribution is the same as the peripheral device. This Vt0 is set with a preferred center value of +0.75V, ranging from +0.5V to +1V in accordance with the present invention.

For the storage transistor MC, the Vt distribution of two state SLC shows the erased state (<Vt0H=−1V) and the programmed state (>Vt1L=4V). The Vt ranges of both states can be widely spread without concern of over-erase or over-program. The Vt distribution of the three state MLC in FIG. 3D shows the erased state (<Vt0H=−1V), the first programmed state (>Vt1L=0V; <Vt1H=0.5V) and the second programmed state (>Vt2L=4V). The Vt range of the erased state and the second program state can also be widely spread without concern of over-erase or over-program. However, the first program state should be bit-by-bit programmed to a tightened distribution. During SLC or MLC reading, the gate voltage $V_{SG}$ of MS is set to Vboost for the selected 2T-NOR flash cell, but is set to 0V for the unselected 2T-NOR flash cells to block any leakage for an accurate reading. The preferred voltage is about 4V which is higher than Vt0H (1V) of the access transistor MS by 3V. It can achieve low resistance with high enough current when the 2T-NOR flash cell is applied to the high speed applications.

Figure 4A:
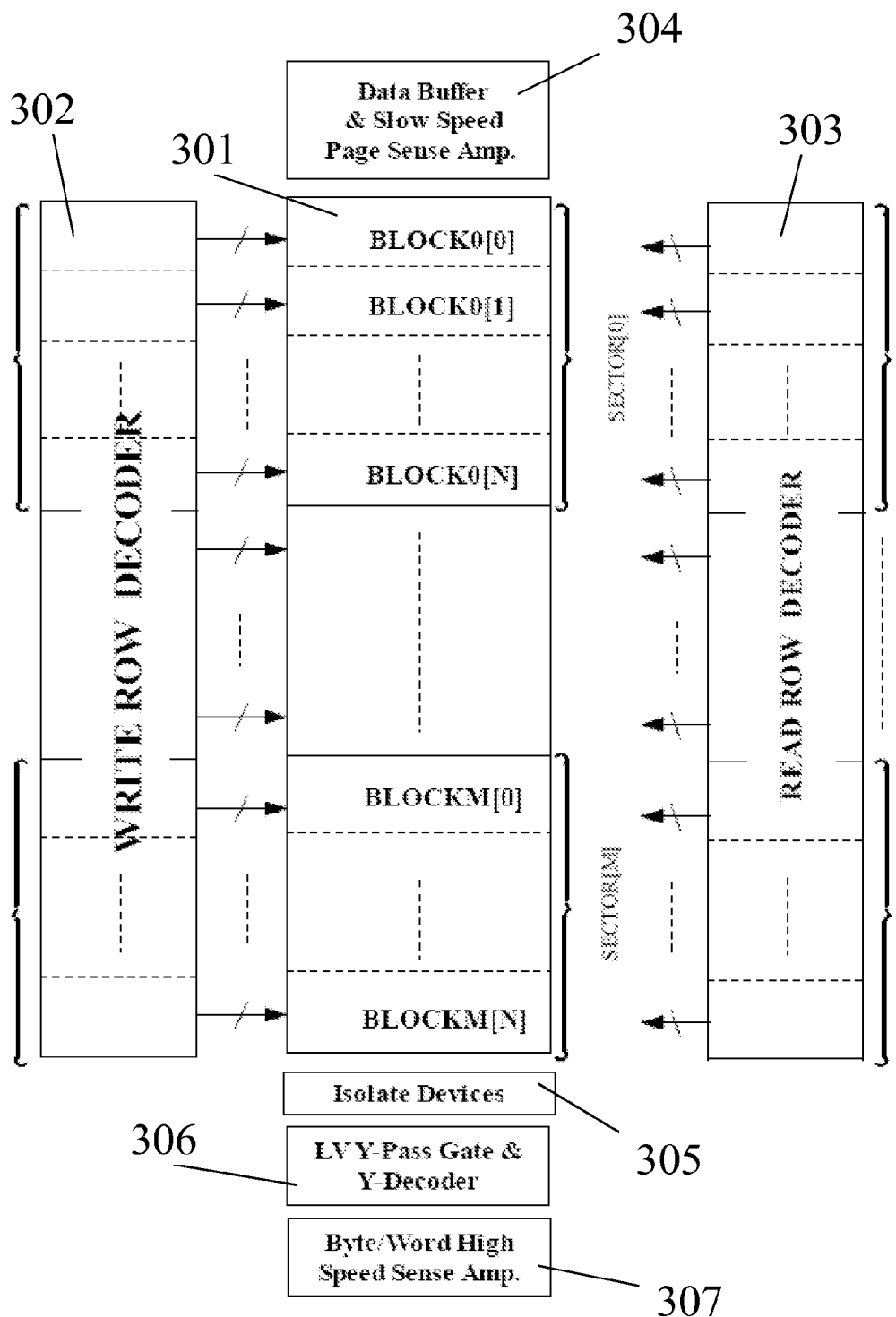
FIG. 4A shows a block diagram of a NAND-based 2T-NOR flash memory device according to the present invention.
Figure 4B:
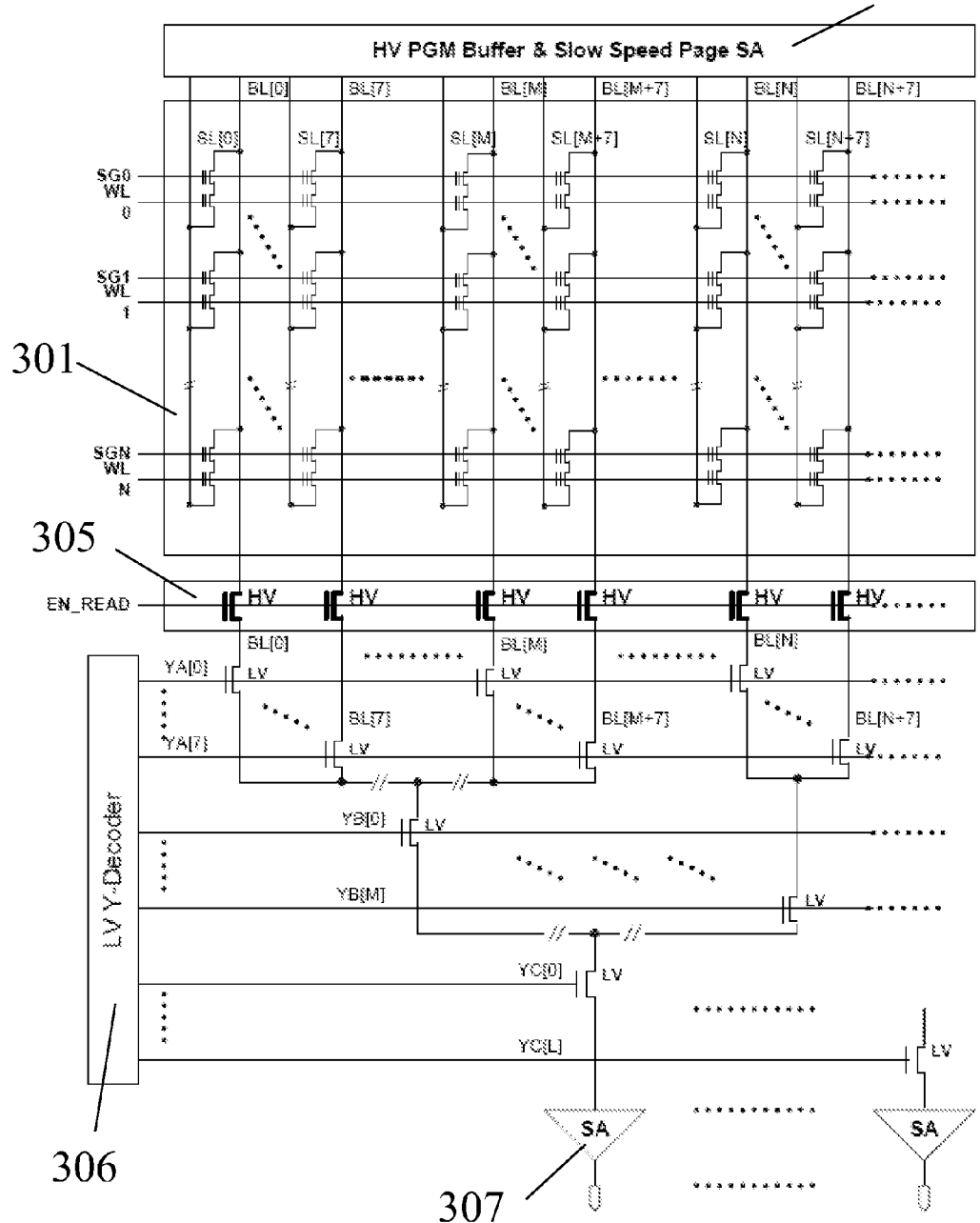
FIG. 4B shows a detailed schematic diagram for the circuit of the high speed sensing scheme of the present invention.

FIG. 4A shows a block diagram of a NAND-based 2T-NOR flash memory device according to the present invention. The flash memory device comprises a memory array 301, a write-row-decoder 302, a read-row-decoder 303, a data buffer and slow speed page sense amplifier unit 304, an isolate device unit 305, a Y-pass gate and Y-decoder unit 306, and a byte/word high speed sense amplifier unit 307. The memory array further comprises a plurality of memory sectors from SECTOR[0] to SECTOR[M]. Each memory sector further comprises a plurality of memory blocks from BLOCK[0] to BLOCK[N]. Each memory block further comprises a plurality memory pages. Each memory page is composed of one row of 2T-NOR flash cells with a word line WL and a select-gate line SG as shown in FIG. 4B.

The outputs of the write-row-decoder 302 are coupled to a plurality of word lines or select-gate lines of the memory array 301. The outputs of the read-row-decoder 303 are coupled to the select-gate lines of the memory array 301. The data buffer and slow speed page sense amplifier unit 304 includes slow speed page sense amplifiers that connect the plurality of bit lines of the memory array 301. It also has a data buffer for storing the program data pattern to perform the program operation. The slow speed page sense amplifiers can be used to do precise Vt verification for pre-program, erase and program operations at a slow speed, low current and page sensing scheme. The connection to the bit lines of the memory array 301 is shut off while fast speed reading is performed by the high speed sense amplifiers in the byte/word high speed sense amplifier unit 307.

The read-row-decoder 303 of the present invention is made of a medium-high voltage device for the boosted voltage to operate at around 4.0V during fast random reading. The fast boosted read-row-decoders 303 is dedicated to the select gate of the access transistor because the cell gate of the storage transistor is tied to the power supply voltage Vdd or a stable boosted voltage source without switching. Because the conventional NAND process does not provide high voltage PMOS devices but provides high voltage enhancement and NMOS devices for operating at 20V, the write-row-decoder 302 is implemented by NMOS devices.

There are two high voltage (HV) enhancement NMOS devices for isolation between the write-row-decoder 302 and read-row-decoder 303 for the access transistors. The two HV NMOS devices separate the write-row-decoder 302 and the read-row-decoder 303. During an erase operation, high voltage can be coupled from the triple P-well of the flash cell by turning off those two HV NMOS devices. By using the read-row-decoder 303 through the isolation HV NMOS device to connect the select gates of access transistors, high driving capability is provided to achieve high speed requirement in some embedded applications.

FIG. 4B shows a detailed diagram for the memory array and the high speed sensing scheme of the present invention. Except for the isolate device unit 305, the Y-pass gates, the Y-decoders 306 and the sense amplifiers 307 are all made of low voltage (LV) devices. The advantage is that higher driving capability can be achieved because of the thin oxide thickness, short channel and high mobility in the LV devices. For a best read performance, the gate voltage of the isolate device unit 305 can be tied to Vboost while reading is performed.

The Y-pass gate and Y-decoder unit 306 includes Y-pass gates and Y-decoders. The isolate device unit 305 is used to isolate the memory array 301 from the Y-pass when erase or program operations are performed. When high speed reading is performed in a high speed sensing scheme, this isolate device unit 305 is turned on as a sensing path for the byte/word high speed sense amplifier unit 307. In the mean time, the Y-pass gates are decoded by the Y-decoders to connect the selected bit lines of the memory array 301. During program and erase operations, all selected bit lines, word lines, and select-gate lines are coupled to the desired voltages as explained in greater details in the subsequent description of the present invention.

Figure 4C:
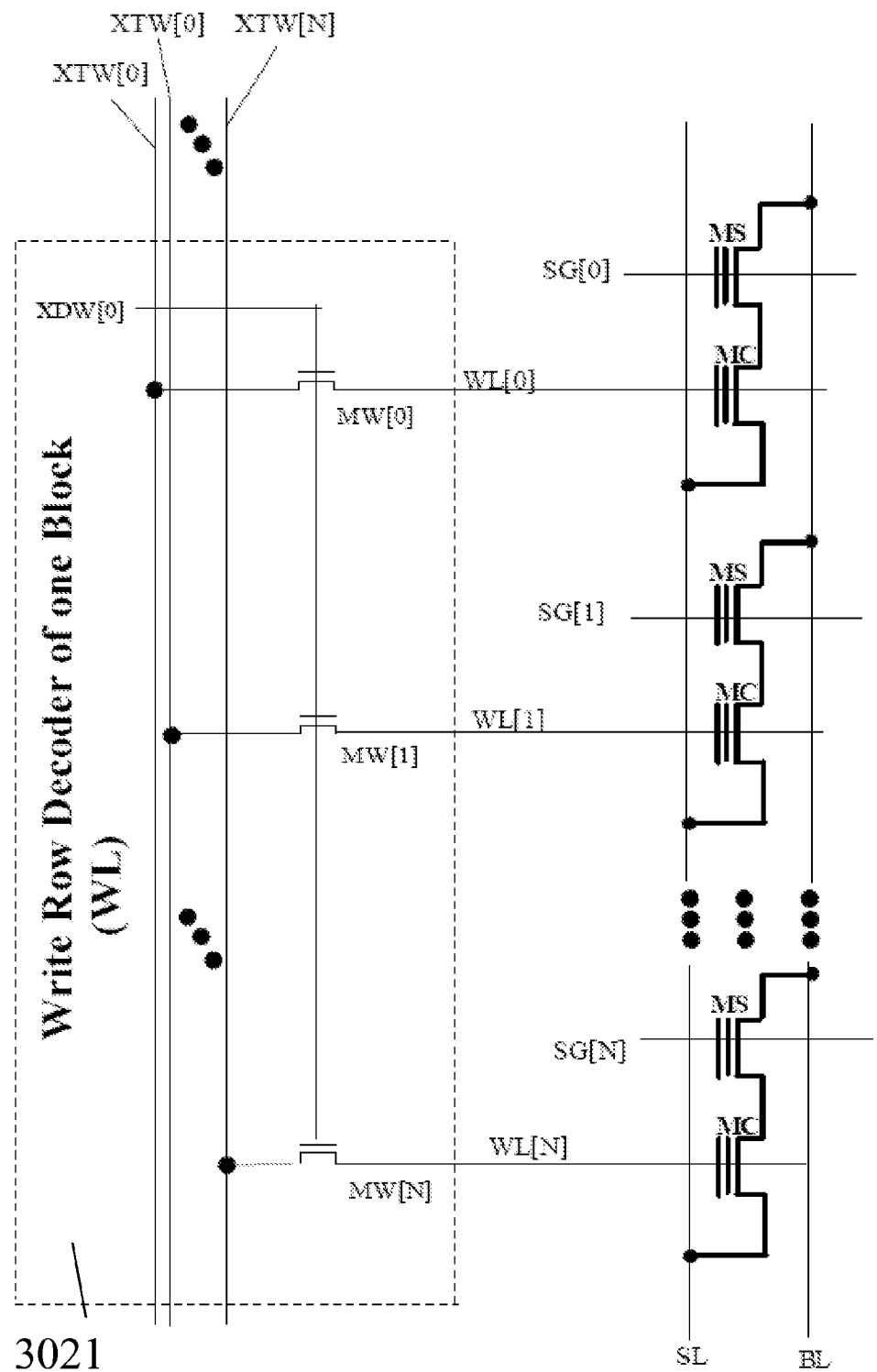
FIG. 4C shows the schematic diagram of the circuit of a block in the write-row-decoder for word lines in all embodiments of the present invention.

FIG. 4C shows the circuit of a block in the WL write-row-decoder 3021 for word lines WL[0], WL[1], ..., and WL[N] in all embodiments. The circuit is used to issue the preferred voltage levels to the storage transistor MC according to different operations of the NAND-based 2T-NOR flash cell of the present invention. For example, during the pre-program operation, all the word lines WL[0], WL[1], ..., and WL[N] have to be applied with 20V. Therefore, XTW[0], XTW[1], ..., and XTW[N] need to be supplied with 20V and XDW[0] needs to be supplied with 22V. During the page erase operation, one of the word lines WL[0], WL[1], ..., and WL[N] has to be applied with 0V and others are floating. Therefore, one of XTW[0], XTW[1], ..., and XTW[N] are supplied with 0V and others are tied to Vdd. XDW[0] is only applied with 1V to turn on one of MW[0], MW[1], ..., and MW[N].

During the block erase operation, all the word lines WL[0], WL[1], ..., and WL[N] have to be applied with 0V and other word lines of the unselected blocks are floating. Therefore, all of XTW[0], XTW[1], ..., and XTW[N] will be applied with 0V. XDW[0] is only applied with 1V to turn on all of MW[0], MW[1], ..., and MW[N]. During the page program operation, one of the word lines WL[0], WL[1], ..., and WL[N] needs to be applied with 15V-20V and others need to be 5V. Therefore, one of XTW[0], XTW[1], ..., and XTW[N] are applied with 15V-20V and others are tied to 5V. XDW[0] is applied with 22V to turn on one of MW[0], MW[1], ..., and MW[N]. During the read operation, all the word lines WL[0], WL[1], ..., and WL[N] have to be applied with Vdd or Vboost. Therefore, all the XTW[0], XTW[1], ..., and XTW[N] are applied with Vdd or Vboost. XDW[0] is applied with Vdd+Vt or Vboost+Vt to turn on all of MW[0], MW[1], ..., and MW[N].

Figure 5A:
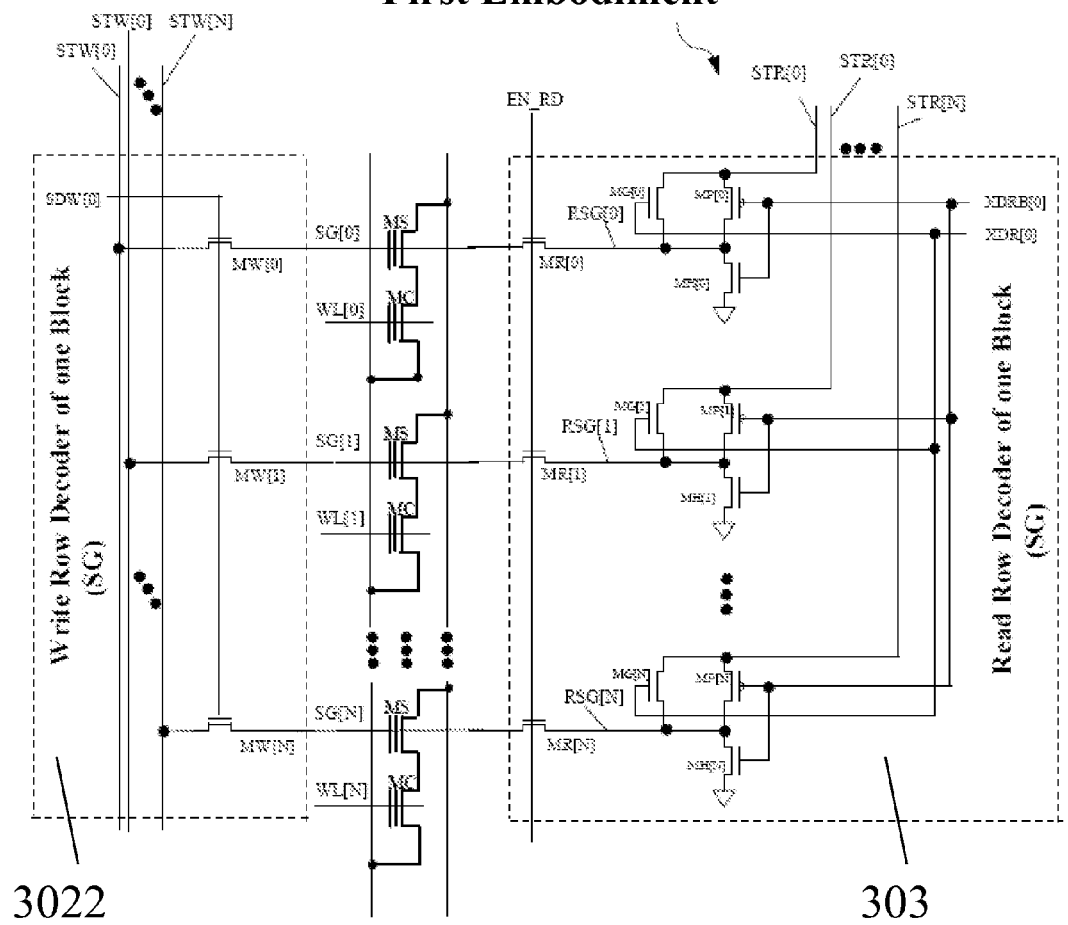
FIG. 5A shows the schematic diagram of the circuit of a block in the write-row-decoder and a block in the read-row-decoder for select-gate lines in the first embodiment of the present invention.

FIG. 5A shows the circuit for a block in the SG write-row-decoder 3022 and a block in the read-row-decoder 303 for select-gate lines SG[0], SG[1], ..., SG[N] in the first embodiment. Because all the access transistors MS need to be programmed to a precisely confined Vt range, i.e., 0.5V-1V, before shipping the product out, there is a need for a collective erase operation before the page-by-page programming on all the access transistors MS. The SG write-row-decoder 3022 is used to issue the preferred voltage levels according to different operations. This SG write-row-decoder 3022, which is used for programming the access transistor MS and only needed in the first embodiment, is different from the WL write-row-decoder 3021 shown in FIG. 4C used in all embodiments for programming the storage transistor MC.

During the pre-program operation for the access transistor MS in the first embodiment, all the select-gate lines SG[0], SG[1], ..., and SG[N] are applied with 20V. Therefore, STW[0], STW[1], ..., and STW[N] need to be supplied with 20V and SDW[0] needs to be supplied with 22V. The line EN_RD is tied to 0V to turn off MR[0], MR[1], ..., and MR[N]. During the chip erase operation, all the select-gate lines SG[0], SG[1], ..., and SG[N] are applied with 0V. Therefore, STW[0], STW[1], ..., and STW[N] are applied with 0V and SDW[0] is only applied with 1V to turn on all MW[0], MW[1], ..., and MW[N]. In addition, EN_RD is tied to 0V to turn off MR[0], MR[1], ..., and MR[N].

During the page program operation for the access transistor MS in the first embodiment, one of the select-gate lines SG[0], SG[1], ..., and SG[N] is applied with 15V-20V and others are applied with 5V. Therefore, one of STW[0], STW[1], ..., and STW[N] is applied with 15V-20V and others are tied to 5V. SDW[0] is applied to 22V to turn on one of MW[0], MW[1], ..., and MW[N]. During the read operation, one of the select-gate lines SG[0], SG[1], ..., and SG[N] is applied with Vboost from the read-row-decoder 303. Therefore, EN_RD is tied to Vboost+Vt and SDW[0] is tied to 0V to shut off all MW[0], MW[1], ..., and MW[N]. One of STR[0], STR[1], ..., and STR[N] is decoded with Vboost voltage level.

The operations and respective voltages applied to the select-gate lines SG[0], SG[1], ..., and SG[N] described above for FIG. 5A are for programming all the access transistors MS to a precisely confined Vt range, i.e., 0.5V-1V, before shipping the product out. Once the access transistors have been programmed to the desired Vt range and the product is in use, the operations of the read-row-decoder 303 and the voltages applied to the select-gate lines are identical to the second and third embodiments of the present invention that are shown in FIGS. 5B and 5C and described in the following disclosure.

Figure 5B:
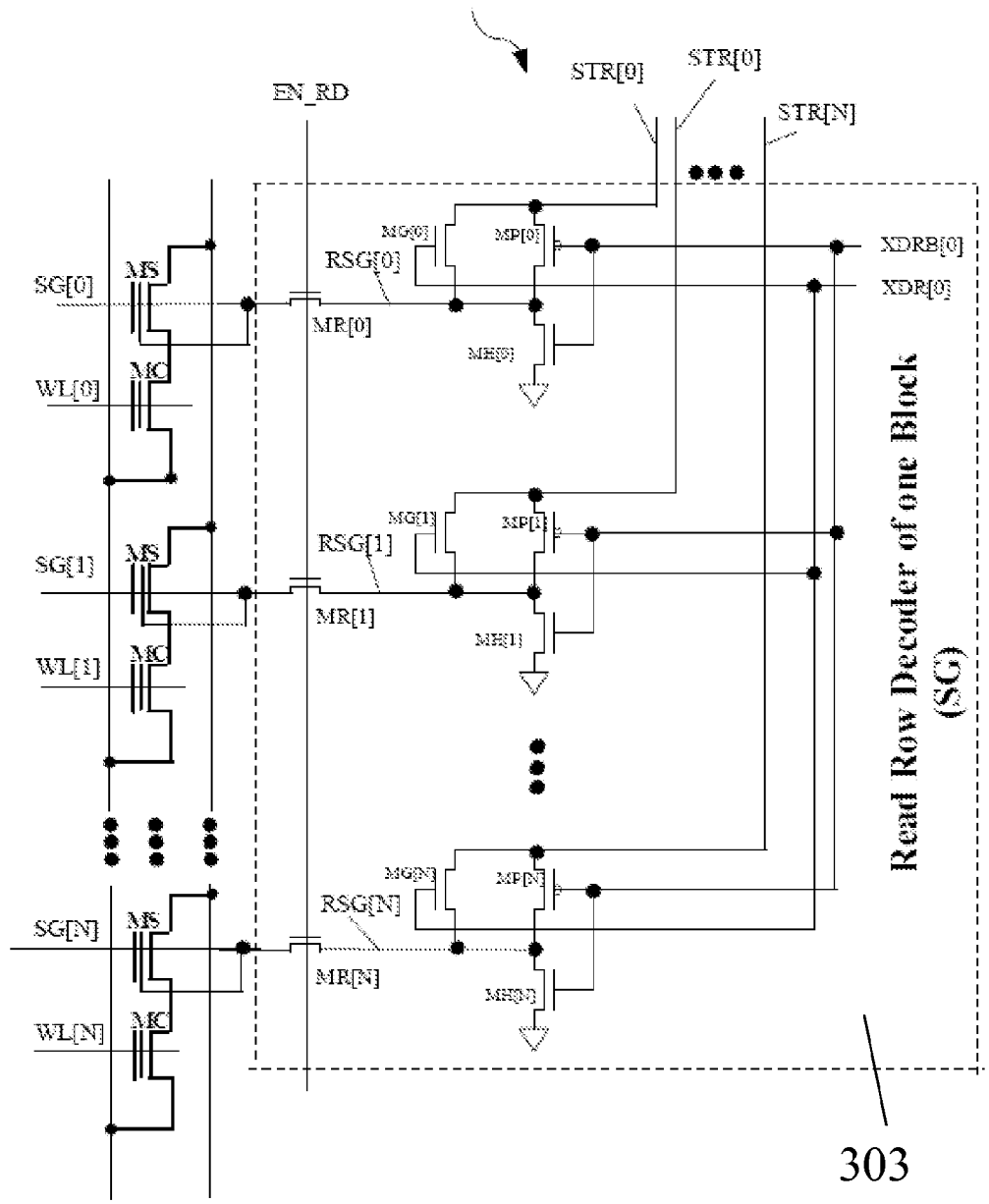
FIG. 5B shows the schematic diagram of the circuit of a block in the read-row-decoder for select-gate lines in the second embodiment of the present invention.

FIG. 5B shows the circuit for a block in the read-row-decoder 303 for select-gate lines SG[0], SG[1], ..., and SG[N] in the second embodiment. All the access transistors are made of a double poly NMOS device with poly1 and poly2 shorted. Because all the access transistors MS have their own Vt distribution, there is no need to have the SG write-row-decoder 3022 of FIG. 5A for the select-gate lines as in the first embodiment. The preferred Vt distribution of the access transistors is similar to the one, i.e., 0.5V-1V, in the first embodiment. During the pre-program operation for the flash cells, all the select-gate lines SG[0], SG[1], ..., and SG[N] are applied with 0V. Therefore, STR[0], STR[1], ..., and STR[N] are supplied with 0V and EN_RD is only applied with 1V to turn on all MR[0], MR[1], ..., and MR[N].

During the erase operation for the flash cells, all the select-gate lines SG[0], SG[1], ..., and SG[N] are floating and coupled to 20V from the TPW of the flash cells. Therefore, EN_RD is tied to 0V to turn off all MR[0], MR[1], ..., and MR[N]. During the page program operation for the flash cells, all of the select-gate lines SG[0], SG[1], ..., and SG[N] are applied with 5V. Therefore, all of STR[0], STR[1], ..., and STR[N] are supplied with 5V. EN_RD is supplied with 5V+Vt to turn on all of MR[0], MR[1], ..., and MR[N]. During the read operation, one of the select-gate lines SG[0], SG[1], ..., and SG[N] is applied with Vboost from the read-row-decoder 303. Therefore, EN_RD is tied to Vboost+Vt to turn on all MR[0], MR[1], ..., and MR[N]. One of STR[0], STR[1], ..., and STR[N] is decoded with Vboost voltage level.

Figure 5C:
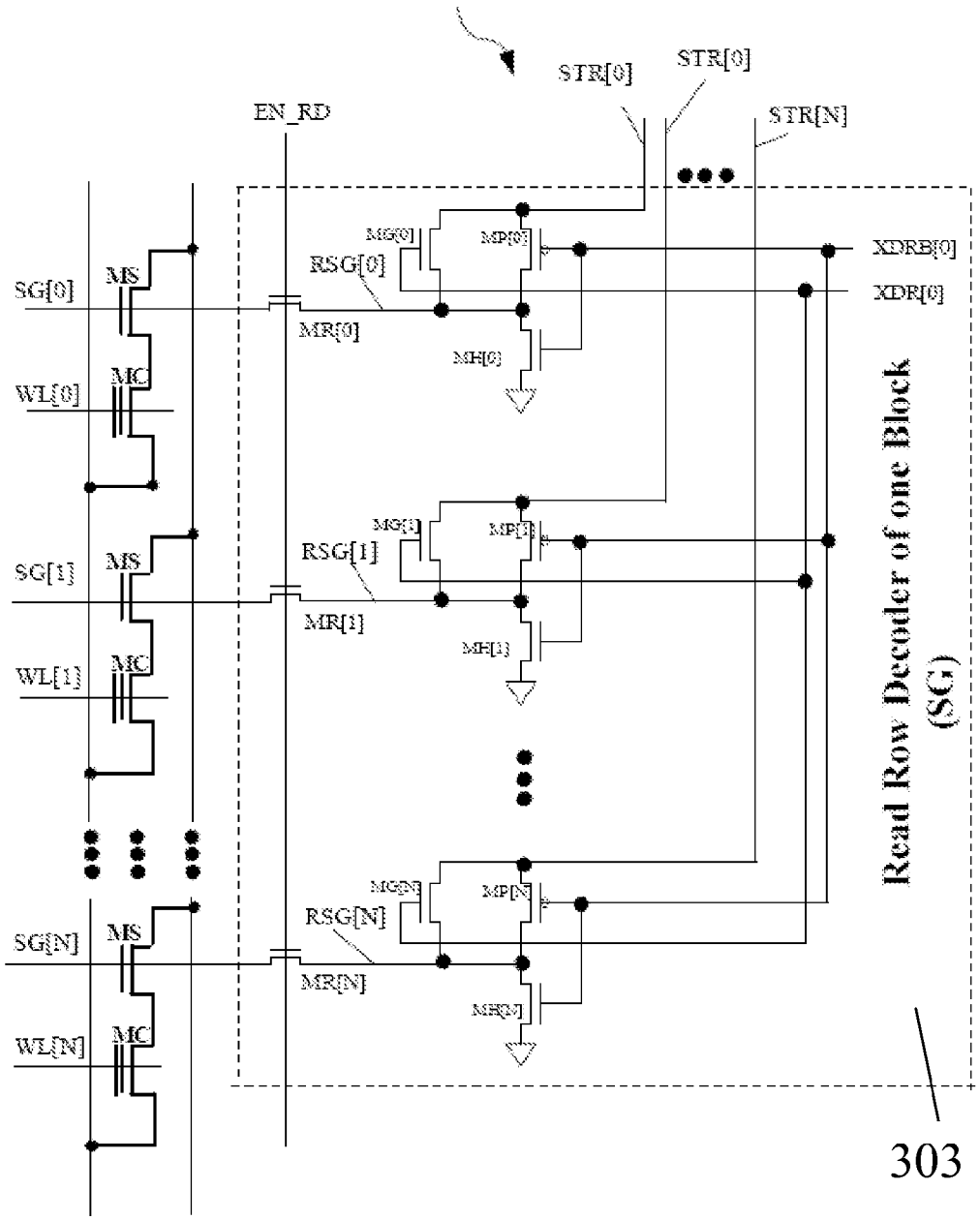
FIG. 5C shows the schematic diagram of the circuit of a block in the read-row-decoder for select-gate lines in the third embodiment of the present invention.

FIG. 5C shows the circuit for a block in the read-row-decoder 303 for select-gate lines SG[0], SG[1], ..., and SG[N] in the third embodiment. All the access transistors are made of poly1 NMOS or poly2 NMOS. Because all the access transistors MS have their own Vt distribution, there is no need of a write-row-decoder 302 as in the first embodiment. The preferred Vt distribution of the access transistors is similar to the one, i.e., 0.5V-1V, in the first embodiment. During the pre-program operation for the flash cells, all the select-gate lines SG[0], SG[1], ..., and SG[N] are applied with 0V. Therefore, STR[0], STR[1], ..., and STR[N] are supplied with 0V and EN_RD is only supplied with 1V to turn on all MR[0], MR[1], ..., and MR[N].

During the erase operation for the flash cells, all the select-gate lines SG[0], SG[1], ..., and SG[N] are floating and coupled to 20V. Therefore, EN_RD is tied to 0V to turn off all MR[0], MR[1], ..., and MR[N]. During the page program operation for the flash cells, all of the select-gate lines SG[0], SG[1], ..., and SG[N] are applied with 5V. Therefore, all of STR[0], STR[1], ..., and STR[N] are supplied with 5V. EN_RD is supplied with 5V+Vt to turn on all of MR[0], MR[1], ..., and MR[N]. During the read operation, one of the select-gate lines SG[0], SG[1], ..., SG[N] is applied with Vboost from the read-row-decoder 303. Therefore, EN_RD is tied to Vboost+Vt to turn on all MR[0], MR[1], ..., and MR[N]. One of STR[0], STR[1], ..., and STR[N] is decoded with Vboost voltage level.

Figure 6:
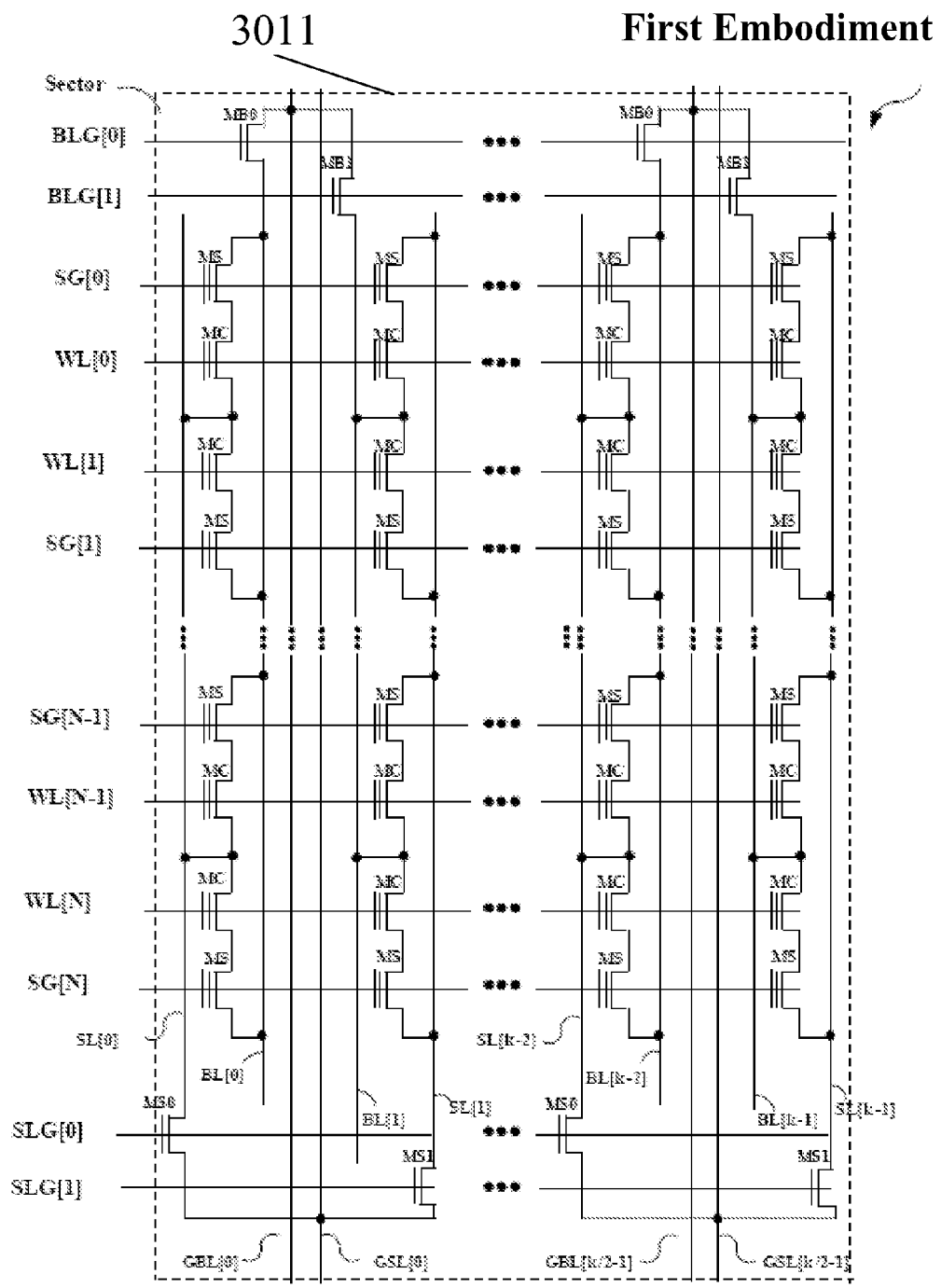
FIG. 6 shows the schematic diagram of the circuit of one sector of a NAND-based 2T-NOR flash memory array according to the first embodiment of the present invention.
Figure 7:
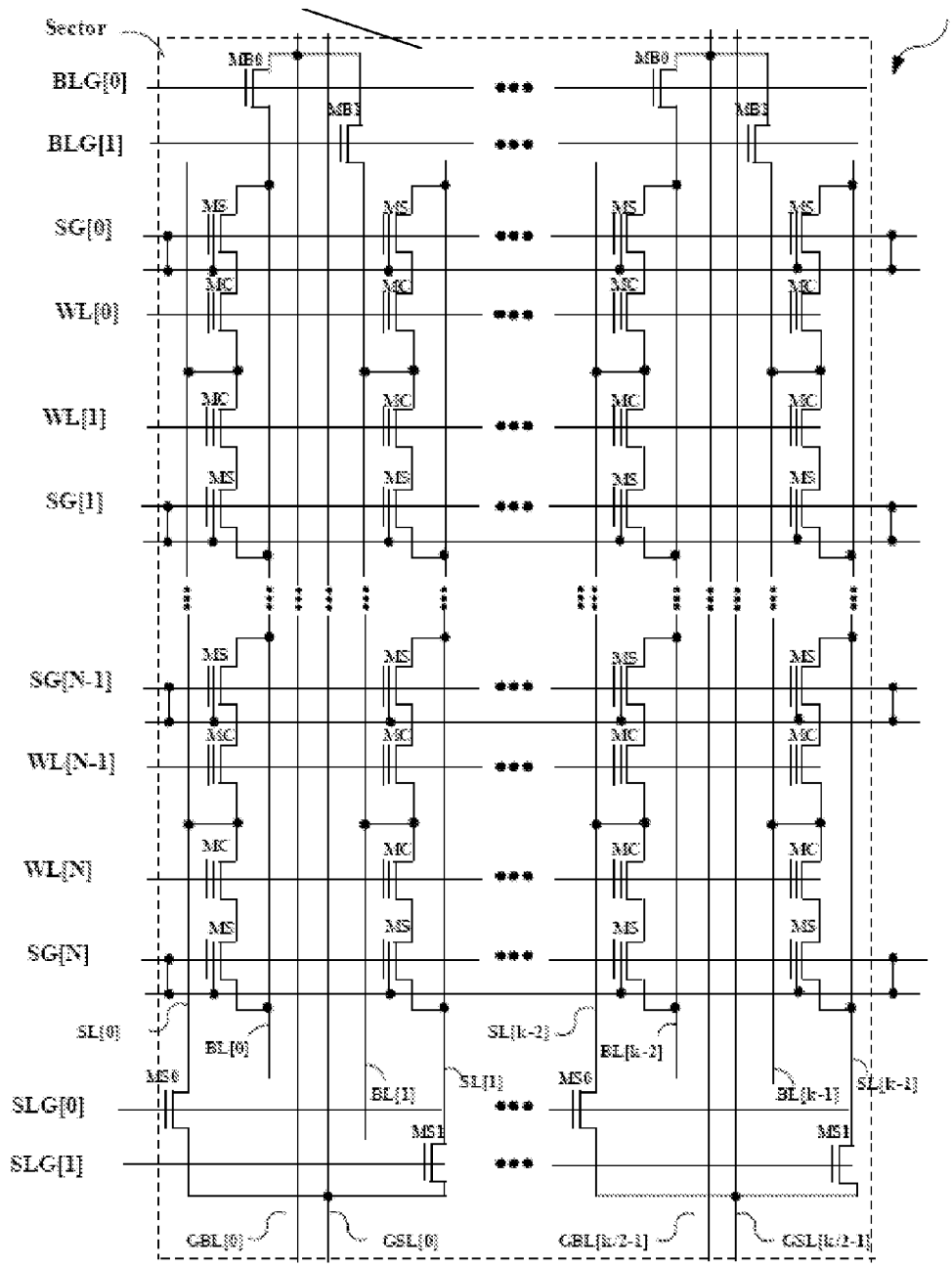
FIG. 7 shows the schematic diagram of the circuit of one sector of a NAND-based 2T-NOR flash memory array according to the second embodiment of the present invention.
Figure 8:
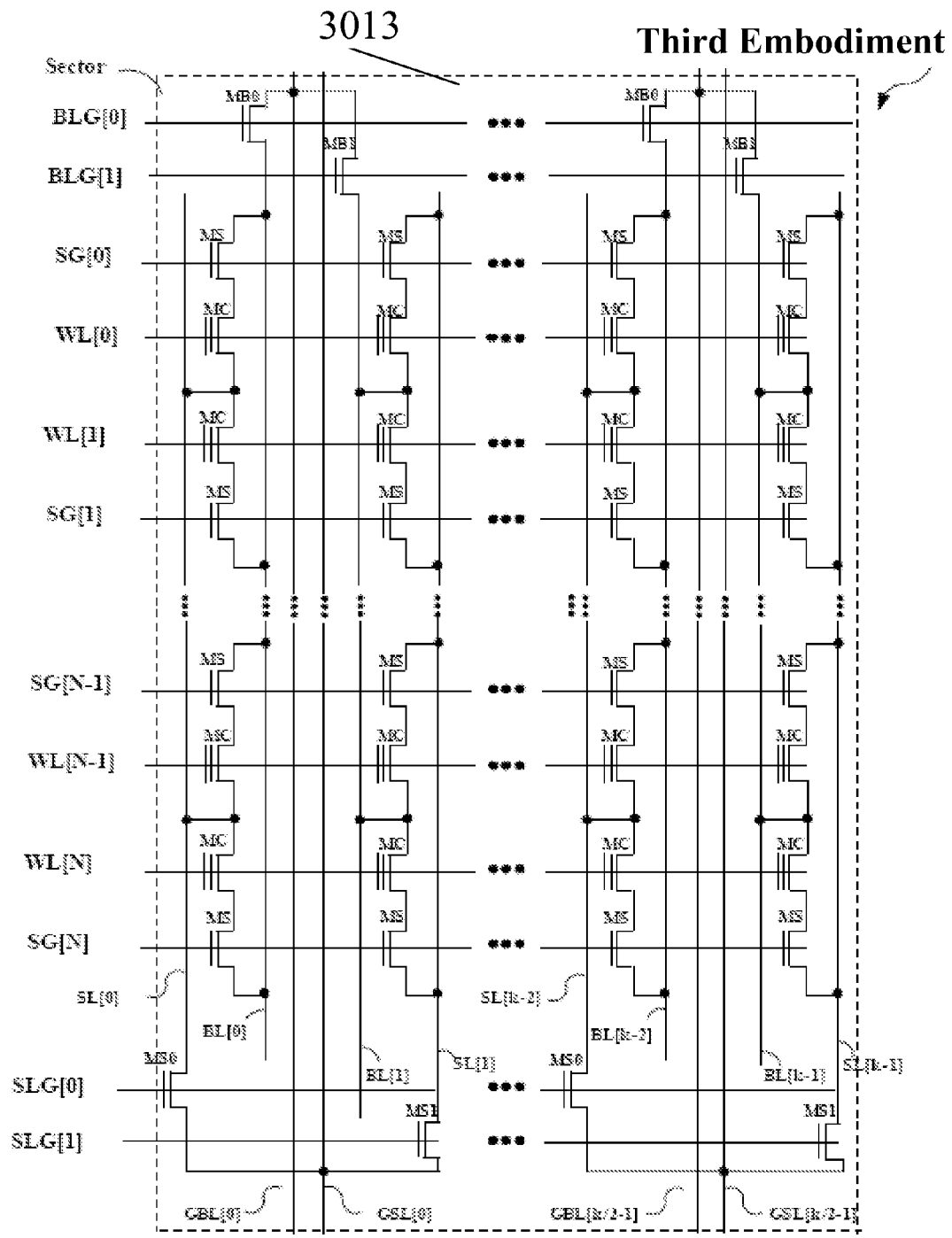
FIG. 8 shows the schematic diagram of the circuit of one sector of a NAND-based 2T-NOR flash memory array according to the third embodiment of the present invention.

FIGS. 6-8 show the preferred circuits of one sector of a NAND-based 2T-NOR flash memory array 3011, 3012, 3013 according to the first, second and third embodiments of the present invention respectively. As can be seen, each sector comprises a plurality of 2T-NOR flash cells with N+1 word lines from WL[0] to WL[N] and N+1 select-gate lines from SG[0] to SG[N] and a plurality of K bit lines from BL[0] to BL[K−1] and a plurality of K source lines from SL[0] to SL[K−1]. Every two bit lines are decoded by BLG[0] and BLG[1] to form one common global bit line. In a same manner, every two source lines are decoded by SLG[0] and SLG[1] to form one common global source line. There are K/2 global bit lines from GBL[0] to GBL[K/2−1]/and K/2 global source lines from GSL[0] to GSL[K/2−1]. It should be noted that in the circuit of the second embodiment shown in FIG. 7, the poly1 and poly 2 are shorted and strapped to form an access line to connect a row of access transistors. In the circuit of the third embodiment shown in FIG. 8, the access transistor MS is a poly1 or poly2 NMOS device.

FIG. 9 shows the biased voltages of the NAND-based 2T-NOR flash memory array in a pre-program operation for the storage transistor MC in one selected sector of the present invention. The operations shown in the table of FIG. 9 include page pre-program, page pre-program verify, block pre-program, block pre-program verify, sector/chip pre-program and sector/chip pre-program verify. The respective bias conditions for the selected WL, unselected WL, selected SG, unselected SG, BL, SL, selected BLG, unselected BLG, selected SLG and unselected SLG are shown in the table.

During the page pre-program operation, only the selected WL is applied with 20V, all unselected WLs, all SGs, all BLs and all SLs are applied with 0V. As for all BLGs and SLGs, they are tied to Vdd. During the page pre-program verify operation, only the selected WL is applied with Vt1L for SLC or Vt2L for MLC, all unselected WLs and unselected SGs are applied with 0V. As for all BLGs, SLGs and the selected SG, they are tied to Vdd. All BLs are pre-charged to Vdd−Vt and all SLs are applied with 0V. Once all the selected storage transistors MC are well programmed to have Vt>Vt1L for SLC or Vt>Vt2L for MLC, the pre-charged Vdd−Vt will be retained. Otherwise, each BL is discharged to 0V and it may indicate that another iterative pre-program operation is required.

During the block pre-program operation, only the selected WLs are applied with 20V, all unselected WLs, all SGs, all BLs and all SLs are applied with 0V. As for all BLGs and SLGs, they are tied to Vdd. During the block pre-program verify operation, only the selected WLs are applied with Vt1L for SLC or Vt2L for MLC, all unselected WLs and unselected SGs are applied with 0V. As for all BLGs, SLGs and the selected SGs, they are tied to Vdd. All BLs are pre-charged to Vdd−Vt and all SLs are applied with 0V. Once all the selected storage transistors MC are well programmed to have Vt>Vt1L fro SLC or Vt>Vt2L for MLC, the pre-charged Vdd−Vt will be retained. Otherwise, if any BL is discharged to 0V, it may indicate that another iterative pre-program operation is required.

During the sector/chip pre-program operation, all WLs are applied with 20V, and all SGs are applied with 0V. As for all BLGs and SLGs, they are tied to Vdd. During the sector/chip pre-program verify operation, all WLs are applied with Vt1L for SLC or Vt2L for MLC. As for all BLGs, SLGs and SGs, they are tied to Vdd. All BLs are pre-charged to Vdd−Vt and all SLs are applied with 0V. Once all the selected storage transistors MC are well programmed to have Vt>Vt1L for SLC or Vt>Vt2L for MLC, the pre-charged Vdd−Vt will be retained. Otherwise, each BL is discharged to 0V and it may indicate that another iterative pre-program operation is required because of the pre-program verify failure. Because this biased condition shown in the table is applied to one selected sector in the flash memory array, all the biased voltages of SGs, WLs, BLs, SLs, BLGs, SLGs and TPWs of other unselected sectors are applied with 0V.

FIG. 10 shows the biased voltages of the NAND-based 2T-NOR flash memory array in an erase operation for the storage transistor MC in one selected sector of the present invention. The operations shown in the table of FIG. 10 include page erase, page erase verify, block erase and block/chip erase. The respective bias conditions for the selected WL, unselected WL, selected SG, unselected SG, BL, SL, selected BLG, unselected BLG, selected SLG and unselected SLG are shown in the table.

During the page erase operation, only the selected WL is applied with 0V, all unselected WLs, and all SGs are coupled to the 20V from TPW because of the floating state initially. Because TPW is a P+ doped junction and all BLs as well as all SLs are N+ doped junctions, the 20V is forwarded from TPW to all BLs and SLs during erasing. As for all BLGs and SLGs, they are tied to Vdd for reducing the voltage stress on MB0-MB1 and MS0-MS1 that connect the local bit lines to the global bit lines and the local source lines to the global source lines respectively as shown in FIGS. 6-8.

During the page erase verify operation, all WLs, unselected SGs, unselected BLGs and unselected SLGs are applied with 0V and the selected SG, selected BLG and selected SLG are applied with Vdd. All SLs are applied with 1V and all BLs are pre-discharged to 0V. Once all the selected storage transistors MC are well erased to have Vt<Vt0H=−1V, all BL is charged to 1V. Otherwise, if any BL stays at 0V, it may indicate that another iterative erase operation is required because of page erase verify failure.

During the block erase operation, only the selected WLs are applied with 0V, all unselected WLs, and all SGs are coupled with 20V from TPW because of the floating state initially. Because TPW is a P+ doped junction and all BLs as well as all SLs are N+ doped junctions, 20V will be forwarded from TPW to all BLs and all SLs during erasing. As for all BLGs and SLGs, they are tied to Vdd for reducing the voltage stress on MB0-MB1 and MS0-MS1 that connect the local bit lines to the global bit lines and the local source lines to the global source lines respectively.

During the sector/chip erase operation, all WLs are applied with 0V and all SGs are coupled with 20V from TPW because of the floating state initially. Because of the TPW/N+ junction structure, 20V will be forwarded from TPW to all BLs and all SLs during erasing. As for all BLGs and SLGs, they are tied to Vdd for reducing the voltage stress on MB0-MB1 and MS0-MS1. Due to the basic NOR structure in the memory array, it is impossible to perform block/sector/chip erase verify collectively. Instead, the page erase verify operation will be followed page by page after the block/sector/chip erase operation. Because this biased condition shown in the table is applied to one selected sector in the flash memory array, all the biased voltages of SGs, WLs, BLs, SLs, BLGs, SLGs and TPW of other unselected sectors are applied with 0V.

FIG. 11 shows the biased voltages of the NAND-based 2T-NOR flash memory array in a program operation for the storage transistor MC in one selected sector of the present invention. The operations shown in the table of FIG. 11 include page program and page program verify. The respective bias conditions for the selected WL, unselected WL, selected SG, unselected SG, BL, SL, selected BLG, unselected BLG, selected SLG and unselected SLG are shown in the table.

During the page program operation, only the selected WL is applied with 15V-20V, all unselected WLs, and all SGs are applied with 5V. The corresponding BLs and SLs of the programmed data are applied with 0V. On the contrary, the corresponding BLs and SLs of the program-inhibit data are applied with about 8V. As for selected BLG and SLG, they are tied to 10V for passing program-inhibit voltage or 0V to the corresponding BLs and SLs. As for unselected BLGs and SLGs, they are tied to 0V.

During the page program verify operation, only the selected WL is applied with Vt1L for SLC, Vt1L for MLC or Vt2L for MLC, all unselected WLs, SGs, BLGs and SLGs are applied with 0V. The selected SG, BLG and SLG are applied with Vdd. All BLs are pre-charged to Vdd−Vt and all SLs are applied with 0V. Once all the selected storage transistors MC are well programmed to have Vt>Vt1L for SLC, Vt>Vt1L for MLC or Vt>Vt2L for MLC, the pre-charged Vdd−Vt will be retained. Otherwise, if any BL is discharged to 0V, it may indicate that another iterative page program operation is required because of the page program verify failure. Because this biased condition shown in the table is applied to one selected sector in the flash memory array, all the biased voltages of SGs, WLs, BLs, SLs, BLGs, SLGs and TPWs of other unselected sectors are applied with 0V.

FIG. 12 shows the biased voltages of the NAND-based 2T-NOR flash memory array in a read operation for the storage transistor MC in one selected sector of the present invention. The respective bias conditions of the selected WL, unselected WL, selected SG, unselected SG, BL, SL, selected BLG, unselected BLG, selected SLG and unselected SLG are shown in the table.

During the read operation, all WLs are applied with Vdd or Vboost. In other words, there is no WL switching. In current applications, the low voltage Vdd may be 1.6V-1.8V or 2.7V-3.6V. As for the selected SG, the voltage always needs to be boosted to Vboost, i.e., 4V for gaining the driving capability with low resistance. The selected BLG and SLG are decoded to Vdd and unselected SGs, BLGs and SLGs are applied with 0V. Because this biased condition shown in the table is applied to one selected sector in the flash memory array, all the biased voltages of SGs, WLs, BLs, SLs, BLGs, SLGs and TPWs of other unselected sectors are applied with 0V.

Figure 13:
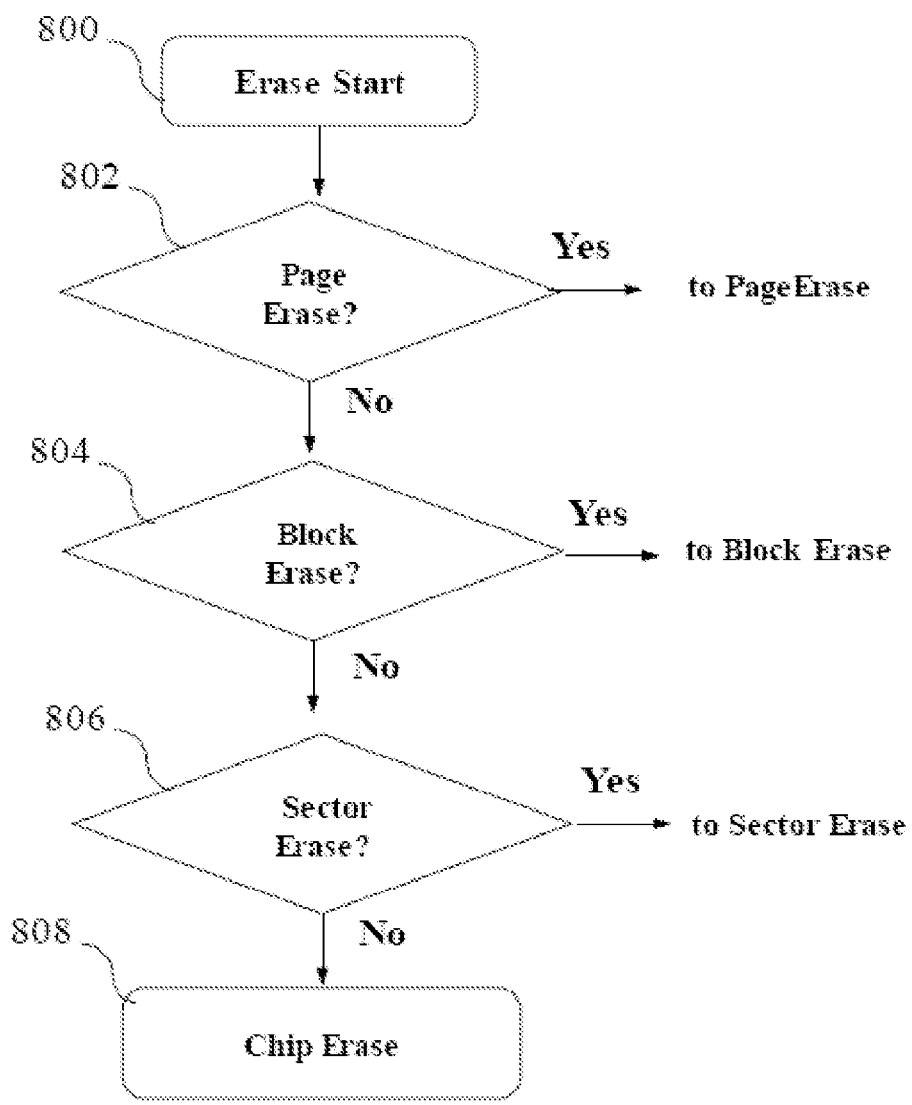
FIG. 13 shows the flow chart of the erase operation for the NAND-based 2T-NOR flash memory array of the present invention.

FIG. 13 shows the flow chart of the erase operation for the NAND-based 2T-NOR flash memory of the present invention. The erase operation includes four different types of erase operations. According to the needs of the erase size for different applications, there are page erase 802, block erase 804, sector erase 806 and chip erase 808 operations in the present invention.

Figure 14:
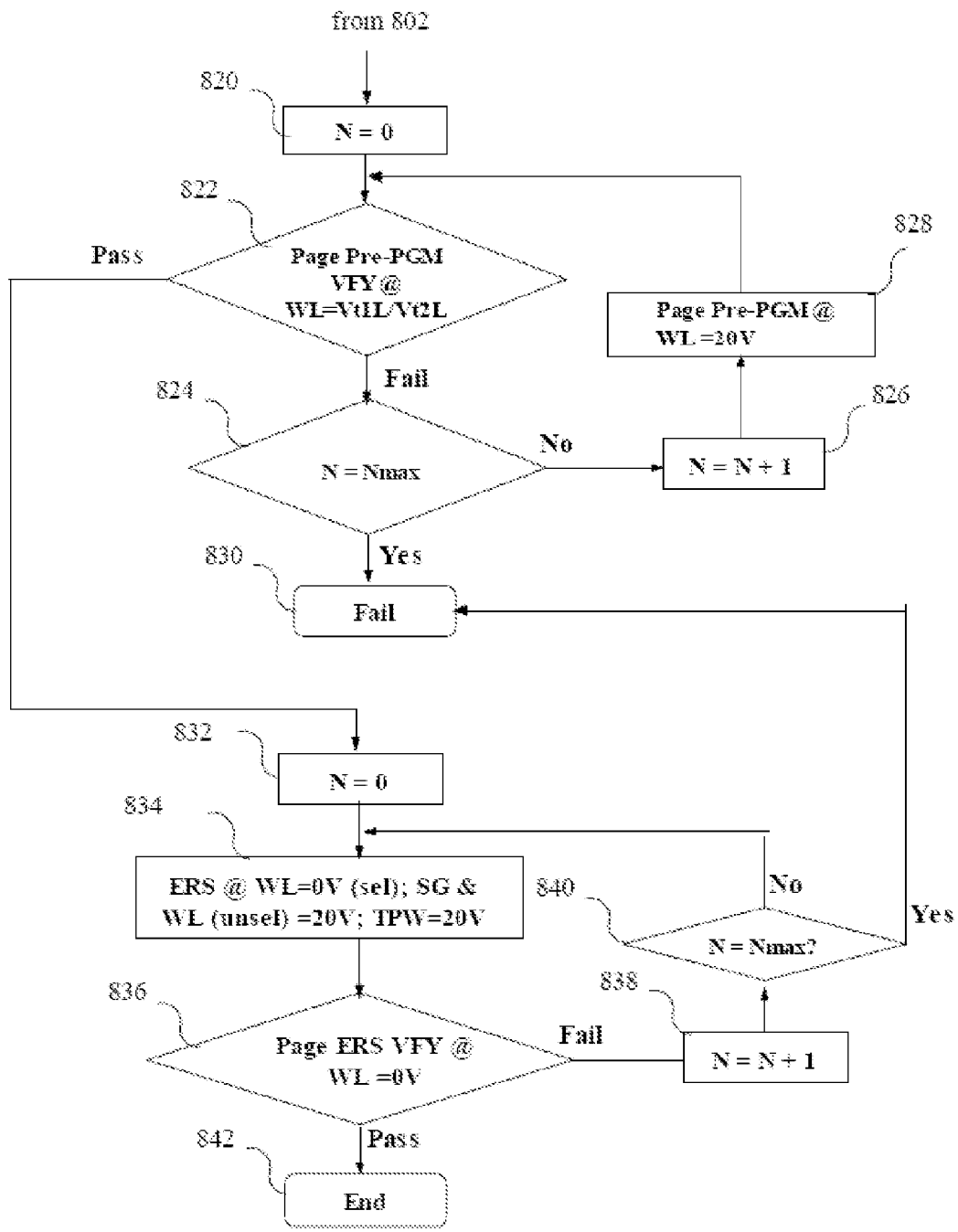
FIG. 14 shows the flow chart of the page erase operation shown in FIG. 13 for the NAND-based 2T-NOR flash memory array of the present invention.

FIG. 14 shows the flow chart of the page erase operation 802 for the NAND-based 2T-NOR flash memory array of the present invention. From step 820 to step 830, the page pre-program operation is executed before the erase operation. In step 820, the pre-program operation count N is set to 0. The following step 822 determines whether all the Vt of the storage transistors of the selected page are larger than Vt1L for SLC or Vt2L for MLC or not. If all the Vt are larger than Vt1L for SLC or Vt2L for MLC, the operation goes directly to step 832 for starting the page erase operation. Otherwise, the next step 824 determines whether the pre-program operation count N exceeds the maximum allowed number or not. If it does, the device is treated as a bad die in step 830. Otherwise, the pre-program operation count N is incremented by 1 in step 826. The following step 828 continues to perform the page pre-program operation.

After the pre-program operation is completed, the page erase operation count is set to 0 in step 832. The next step 834 sets the selected WL to 0V, and all unselected WLs and all SGs to floating. Once TPW is applied with 20V, all unselected WLs and all SGs are coupled to 20V, and all BLs and all SLs are forwarded to 20V as well. If the erase operation in step 834 is completed within a predetermined erase time, the page erase verify operation in step 836 follows to determine whether all the Vt of the storage transistors of the selected page are less than −1V or not. If all of them are less than −1V, a successful page erase operation has been achieved in step 842. Otherwise, the page erase operation count N is incremented by 1 in step 838. The next step 840 determines whether the page erase operation count N exceeds the maximum allowed number or not. If it does, the device is treated as a bad die in step 830. Otherwise, the page erase operation is continued in step 834.

Figure 15:
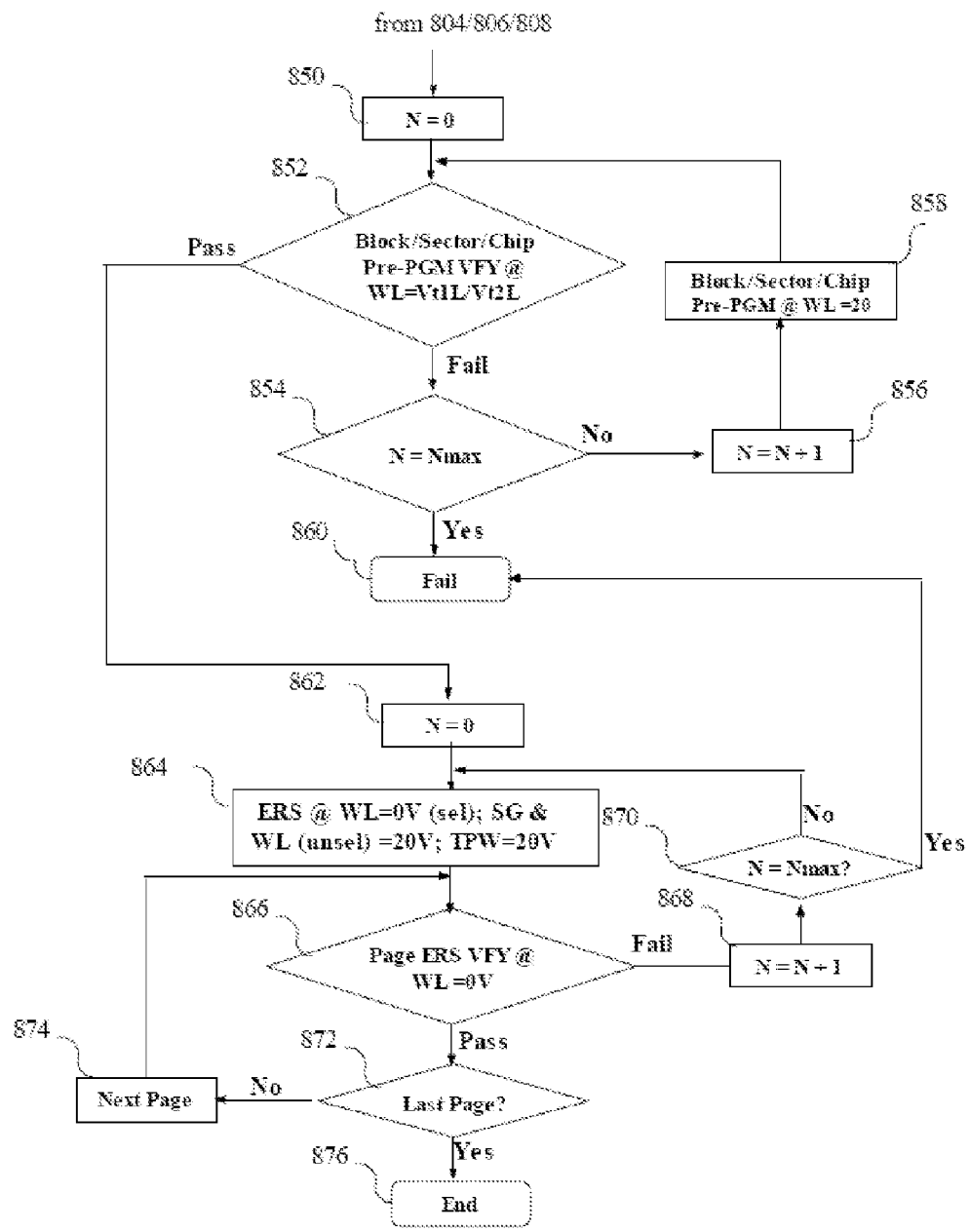
FIG. 15 shows the flow chart of the block, sector or chip erase operation shown in FIG. 13 for the NAND-based 2T-NOR flash memory array of the present invention.

According to the present invention, the block, sector or chip erase operation for the NAND-based 2T-NOR flash memory array has similar steps in the respective erase operation. FIG. 15 shows the flow chart of the steps performed in the block, sector or chip erase operation. From step 850 to step 860, the block, sector or chip pre-program operation is executed before the erase operation. In step 850, the pre-program operation count N is set to 0. The following step 852 determines whether all the Vt of storage transistors of the selected block, sector or chip are larger than Vt1L for SLC or Vt2L for MLC or not. If all the Vt are larger than Vt1L for SLC or Vt2L for MLC, the operation goes directly to step 862 for starting block, sector or chip erase operation. Otherwise, the next step 854 determines whether the block, sector or chip pre-program operation count N exceeds the maximum allowed number or not. If it does, the device is treated as a bad die in step 860. Otherwise, the block, sector or chip pre-program operation count N is incremented by 1 in step 856. The following step 858 continues to perform the block, sector or chip pre-program operation collectively.

After the block, sector or chip pre-program operation is completed, the block, sector or chip erase operation count is set to 0 in step 862. The next step 864 sets the selected WLs to 0V, and all unselected WLs and all SGs to floating. Once TPW is applied with 20V, all unselected WLs and all SGs are coupled to 20V and all BLs and all SLs are forwarded with 20V as well. If the block, sector or chip erase operation in step 864 is completed collectively within a predetermined erase time, the page erase verify operation in step 866 follows to determine whether all the Vt of storage transistors of the selected page are less than −1V or not. If all of them are less than −1V, the following step 872 determines whether it is the last page or not. If it is the last page, a successful block, sector or chip erase operation has been achieved in step 876. Otherwise, the next page is selected in step 874 for page erase verification in step 866. If any Vt is determined to be no less than −1V in step 866, the block, sector or chip erase operation count N is incremented by 1 in step 868. The next step 870 determines whether the block, sector or chip erase operation count N exceeds the maximum allowed number or not. If it is does, the device is treated as a bad die in step 860. Otherwise, the page erase operation is continued in step 864.

Figure 16:
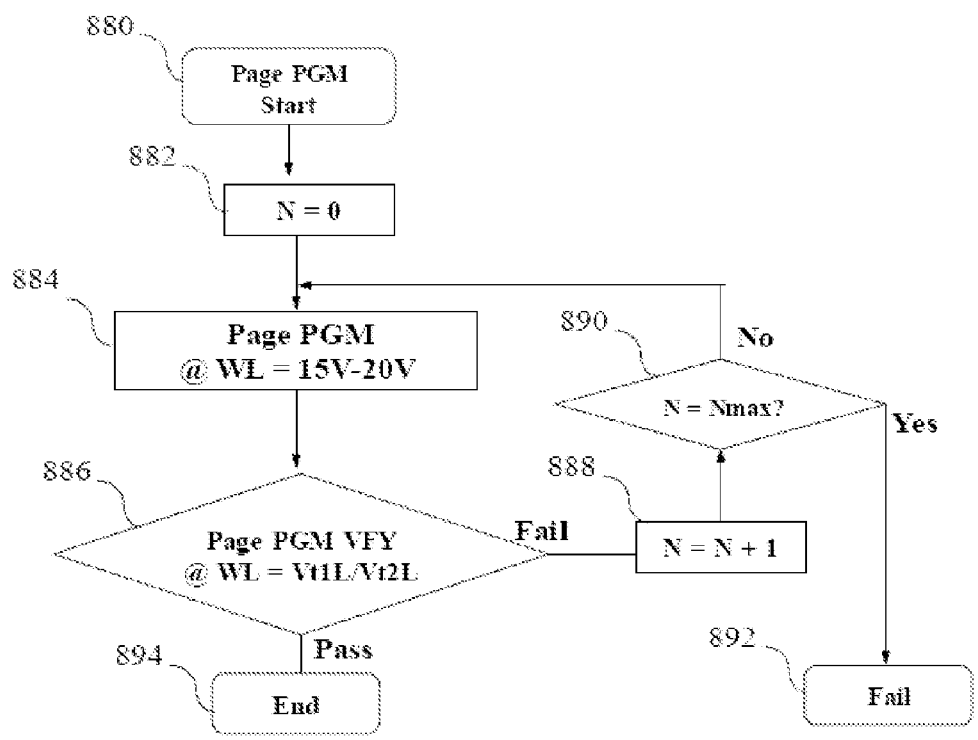
FIG. 16 shows the flow chart of the page program operation for the NAND-based 2T-NOR flash memory array of the present invention.

FIG. 16 shows the flow chart of the page program operation 880 for the NAND-based 2T-NOR flash memory array of the present invention. In step 882, the page program operation count N is set to 0. The following step 884 performs the page program operation by applying 15V-20V to the selected WL. As for other unselected WLs and all SGs, they are all applied with 5V to reduce the disturbance from the inhibit voltage 8V of the SLs and BLs. After the page program operation in step 884 is completed within a predetermined program time, the page program verify operation in step 886 determines whether the programmed Vt of storage transistors of the selected page is larger than Vt1L for SLC, Vt1L for MLC or Vt2L for MLC or not. If it is, a successful page program has been achieved in step 894. Otherwise, the next step 888 increments the page program operation count by 1 and step 890 determines whether the page program operation count N exceeds the maximum allowed number or not. If it does, the device is treated as a bad die in step 892. Otherwise, the page program operation is continued in step 884.

Figure 17:
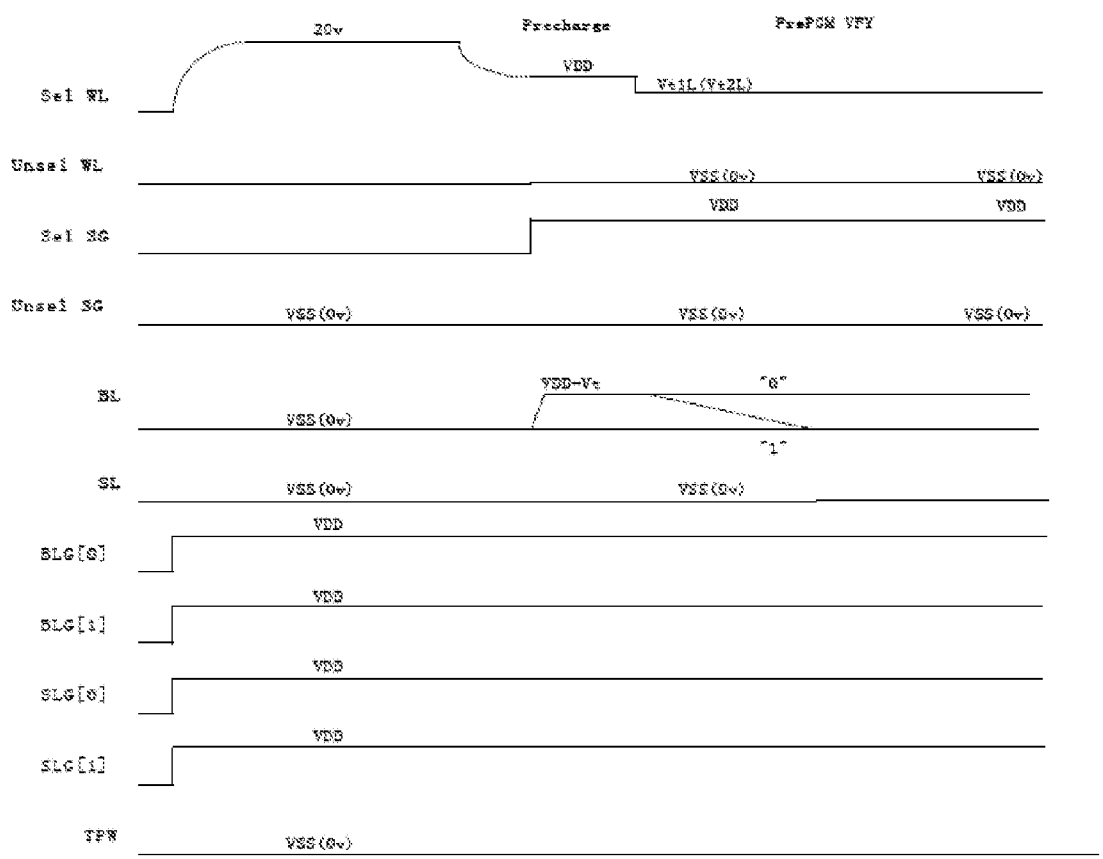
FIG. 17 shows the timing waveforms of the page or block pre-program with verify operation for the NAND-based 2T-NOR flash memory array of the present invention.

FIG. 17 shows the timing waveforms of the page or block pre-program operation for the NAND-based 2T-NOR flash memory array of the present invention. During the page or block pre-program period, only the selected WLs are applied with 20V, all unselected WLs, all SGs, all BLs and all SLs are applied with 0V. As for all BLGs and SLGs, they are tied to Vdd. After the page or block pre-program operation, the selected WLs are discharged to Vdd and the selected SGs are applied with Vdd in the pre-charge period. All BLs are charged to Vdd−Vt for page sensing in the page or block pre-program verify period.

During the page or block pre-program verify period, the selected WLs are applied with Vt1L for SLC or Vt2L for MLC, all unselected WLs and unselected SGs are applied with 0V. As for all BLGs, SLGs and the selected SGs, they are tied to Vdd. After all the selected storage transistors MC are well programmed to have Vt>Vt1L for SLC or Vt>Vt2L for MLC, the pre-charged Vdd−Vt will be retained. Otherwise, if any BL is discharged to 0V, it may indicate that another page or block iterative pre-program operation is required. It should be noted that the timing waveform shown in FIG. 17 is for the selected sector only. For other unselected sectors, the biased voltages of all SGs, WLs, BLs, SLs, BLGs, SLGs and TPWs are applied with 0V.

Figure 18:
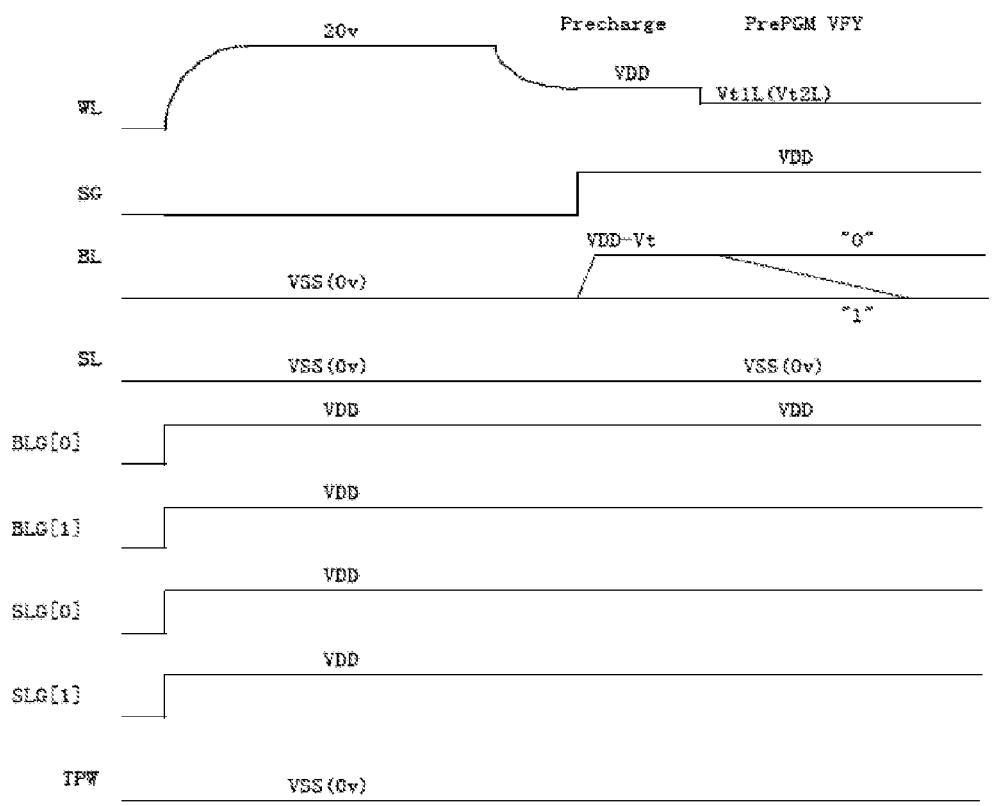
FIG. 18 shows the timing waveforms of the sector or chip pre-program with verify operation for the NAND-based 2T-NOR flash memory array of the present invention.

FIG. 18 shows the timing waveforms of the sector or chip pre-program operation for the NAND-based 2T-NOR flash memory array of the present invention. During the sector or chip pre-program period, all WLs are applied with 20V and all SGs, all BLs and all SLs are applied with 0V. As for all BLGs and SLGs, they are tied to Vdd. After the sector or chip pre-program operation, all WLs are discharged to Vdd and all SGs are applied with Vdd in the pre-charge period. All BLs are charged to Vdd−Vt for page sensing in the sector or chip pre-program verify period.

During the sector or chip pre-program verify period, all WLs are applied with Vt1L for SLC or Vt2L for MLC. As for all BLGs, SLGs and SGs, they are tied to Vdd. After all the selected storage transistors MC are well programmed to have Vt>Vt1L for SLC or Vt>Vt2L for MLC, the pre-charged Vdd−Vt will be retained. Otherwise, if any BL is discharged to 0V, it may indicate that another iterative sector or chip pre-program operation is required. This timing waveform is for the selected sector only. For other unselected sectors, the biased voltages of all SGs, WLs, BLs, SLs, BLGs, SLGs and TPWs are applied with 0V.

Figure 19:
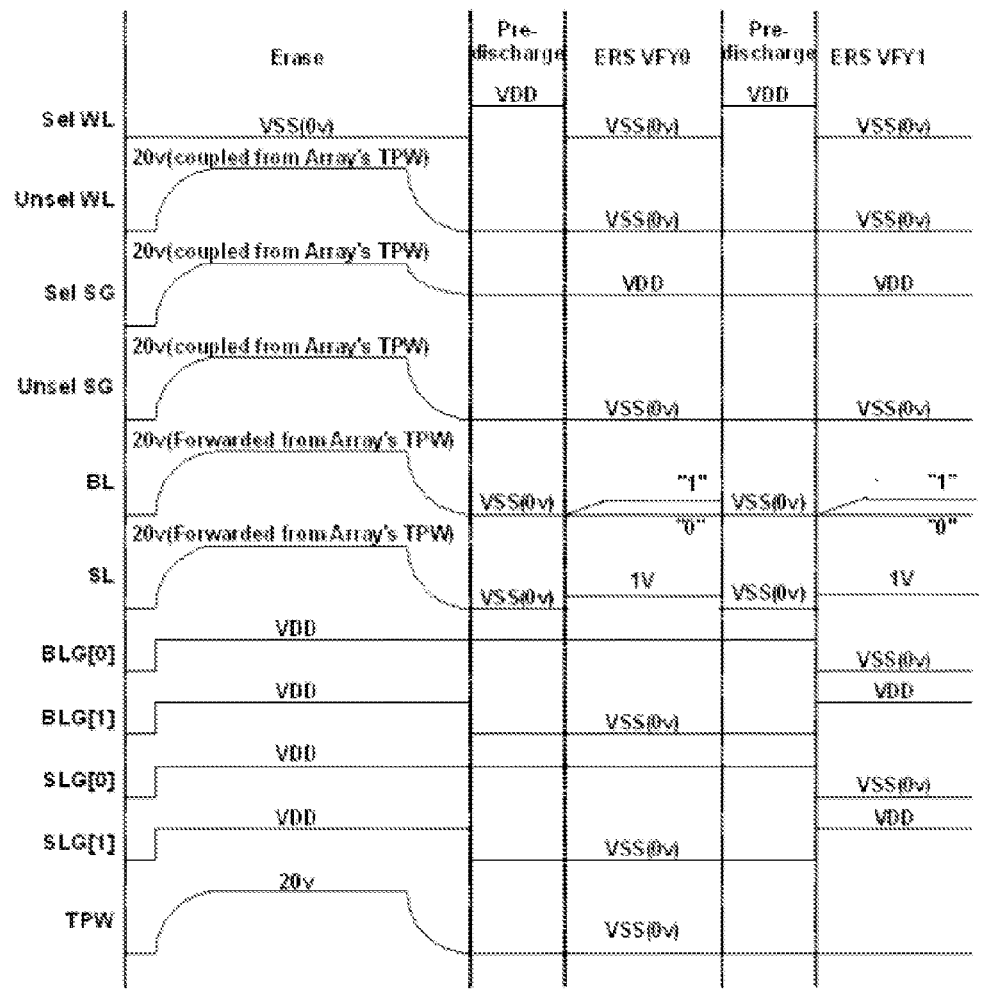
FIG. 19 shows the timing waveforms of the page erase with verify operation for the NAND-based 2T-NOR flash memory array of the present invention.

FIG. 19 shows the timing waveforms of page erase operation for the NAND-based 2T-NOR flash memory array of the present invention. During the page erase period, only the selected WL is applied with 0V, all unselected WLs, all SGs, all BLs and all SLs are set to floating. Once TPW is applied with 20V, all unselected WLs and all SGs are coupled to 20V and all BLs and all SLs are forwarded with 20V as well. As for all BLGs and SLGs, they are tied to Vdd for reducing the voltage stress on MB0-MB1 and MS0-MS1. After the page erase operation, the selected WL are charged to Vdd and the selected SG is applied with Vdd in the pre-discharge period.

Due to the special array architecture in the present invention, only half of the global bit lines can be sensed for verification. One half of all BLs are discharged to 0V for page sensing in the first half page verify period during which all WLs and unselected BLGs and unselected SLGs are applied with 0V. As for the selected BLG, selected SLG and selected SG, they are applied with Vdd. All SLs are applied with 1V. After all the selected storage transistors MC are well erased to have Vt<Vt0H=−1V, the first half of all BLs are charged to 1V. Otherwise, if any BL stays at 0V, it may indicate that another iterative erase operation is required because of page erase verify failure. In a same manner, the erase verification of the second half of the storage transistors MC of the same page is followed if the first half storage transistors of the page pass the erase verification. The timing waveform is for the selected sector only. For other unselected sectors, the biased voltages of all SGs, WLs, BLs, SLs, BLGs, SLGs and TPWs are applied with 0V.

Figure 20:
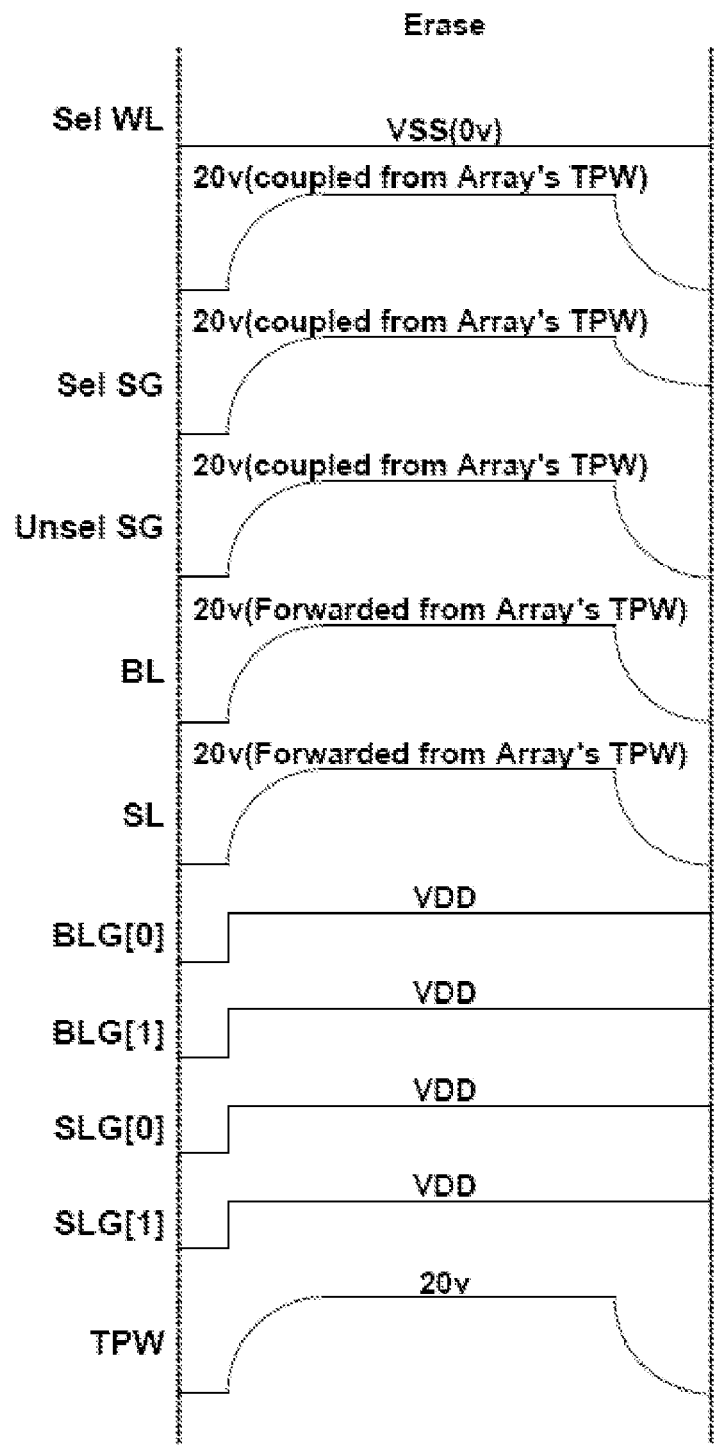
FIG. 20 shows the timing waveforms of the block erase operation for the NAND-based 2T-NOR flash memory array of the present invention.

FIG. 20 shows the timing waveforms of the block erase operation for the NAND-based 2T-NOR flash memory array of the present invention. During the block erase period, only the selected WLs are applied with 0V, all unselected WLs, all SGs, all BLs and all SLs are set to floating. Once TPW is applied with 20V, all unselected WLs and all SGs are coupled to 20V and all BLs and all SLs are forwarded with 20V as well. As for all BLGs and SLGs, they are tied to Vdd for reducing the voltage stress on MB0-MB1 and MS0-MS1. After the block erase period, the block erase verification is accomplished with the page erase verify operation shown in FIG. 19 by verifying the pages in the block page by page. The timing waveform is for the selected sector only. For other unselected sectors, the biased voltages of all SGs, WLs, BLs, SLs, BLGs, SLGs and TPWs are applied with 0V.

Figure 21:
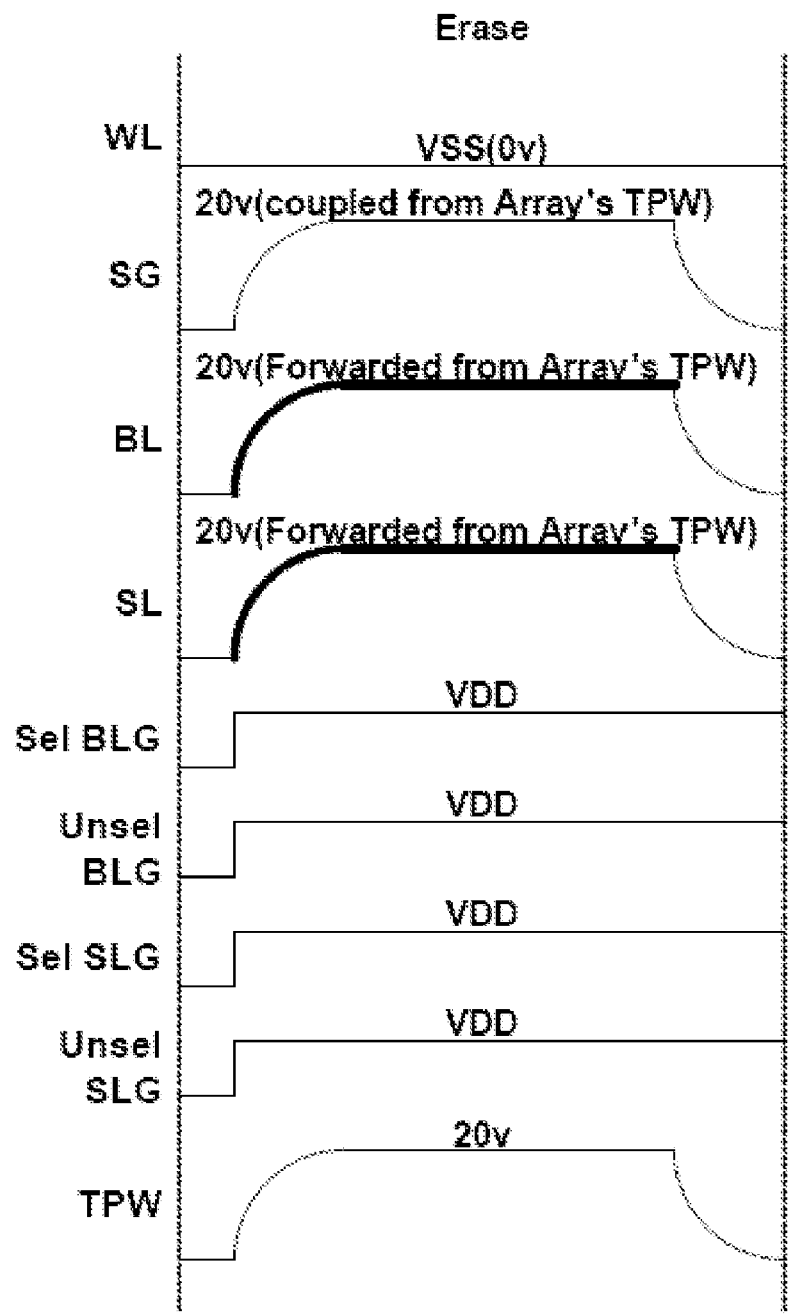
FIG. 21 shows the timing waveforms of the sector or chip erase operation for the NAND-based 2T-NOR flash memory array of the present invention.

FIG. 21 shows the timing waveforms of the sector or chip erase operation for the NAND-based 2T-NOR flash memory array of the present invention. During the sector or chip erase period, all WLs are applied with 0V, and all SGs, all BLs and all SLs are set to floating. Once TPW is applied with 20V, all SGs are coupled to 20V and all BLs and all SLs are forwarded with 20V as well. As for all BLGs and SLGs, they are tied to Vdd for reducing the voltage stress on MB0-MB1 & MS0-MS1. After the sector or chip erase period, the sector or chip erase verification is accomplished with the page erase verify operation shown in FIG. 19 by verifying the pages in the sector or chip page by page. The timing waveform is for the selected sector only. For other unselected sectors, the biased voltages of all SGs, WLs, BLs, SLs, BLGs, SLGs and TPWs are applied with 0V.

Figure 22:
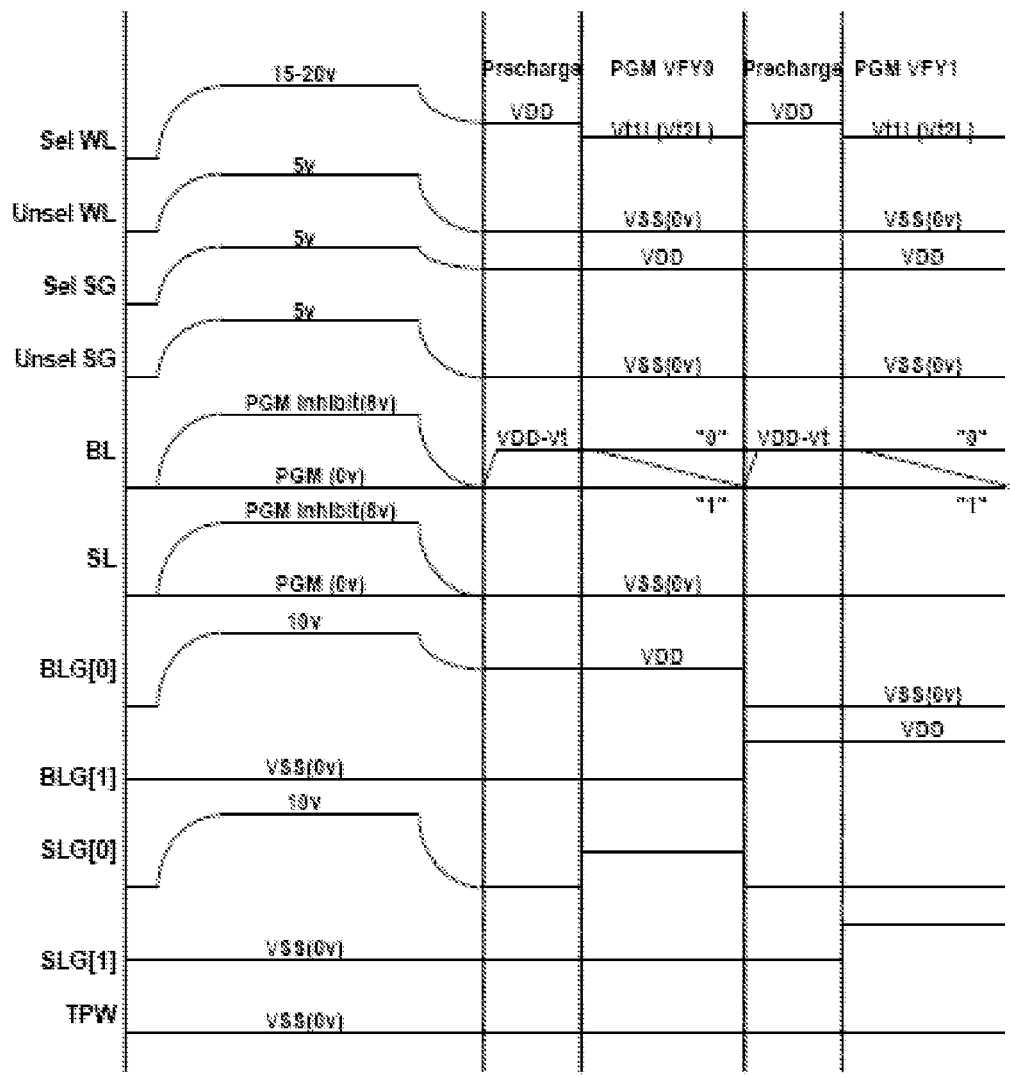
FIG. 22 shows the timing waveforms of the page program with verify operation for the NAND-based 2T-NOR flash memory array of the present invention.

FIG. 22 shows the timing waveforms of the page program operation for the NAND-based 2T-NOR flash memory array of the present invention. During the page program period, only the selected WL is applied with 15V-20V and all unselected WLs, and all SGs are applied with 5V to reduce the disturbance from the inhibit voltage 8V from the SLs and BLs. To program the storage transistor MC, the corresponding BL and SL are applied with 0V. On the contrary, to inhibit the program to the storage transistors, the corresponding BL and SL are applied with about 8V. The selected BLG and SLG are applied with 10V and the unselected BLGs and SLGs are applied with 0V. If the page program operation is completed within a predetermined program time, the page program verify operation is executed.

Again, due to the special array architecture of the present invention, only half of the global bit lines can be sensed for verification. One half of all BLs are pre-charged to Vdd−Vt for page sensing in the first half page verify period during which all WLs and unselected BLGs and unselected SLGs are applied with 0V. As for the selected BLG, selected SLG and selected SG, they are applied with Vdd. After all the programmed Vt of the selected storage transistors of the selected page is larger than Vt1L (SLC/MLC) or Vt2L (MLC), the first half of all BLs are retained at VDD-Vt. Otherwise, if any BL stays at 0V, it may indicate that another iterative page program operation is required because of page program verify failure. Note that both BL and SL are switched to an inhibit voltage for the cells that have been verified while the next page program operation is performed. According to this scheme, the tightened Vt distribution can be achieved. In a same manner, the page program verification of the second half of the storage transistors MC of the same page is followed if the first half storage transistors of the page pass the page program verification. The timing waveform is for the selected sector only. For other unselected sectors, the biased voltages of all SGs, WLs, BLs, SLs, BLGs, SLGs and TPWs are applied with 0V.

Although the present invention has been described with reference to the exemplary embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A NAND-based 2T-NOR flash memory device comprising:
   a NAND-based 2T-NOR flash memory array having a plurality of memory sectors, each memory sector having a plurality of memory blocks, each memory blocks having a plurality of memory pages, and each memory page having one row of NAND-based 2T-NOR flash cells with one word line and one select-gate line;
   a write-row-decoder coupled to the word lines of said flash memory array;
   a read-row-decoder coupled to the select-gate lines of said flash memory array;
   a data buffer and slow speed page sense amplifier unit connected to a plurality of bit lines of said flash memory array, said data buffer and slow speed page sense amplifier unit having slow speed page sense amplifiers and a data buffer for storing program;
   a Y-pass gate and Y-decoder unit having Y-pass gates and Y-decoders;
   a byte/word high speed sense amplifier unit connected to said Y-pass gate and Y-decoder unit, said byte/word high speed sense amplifier unit having high speed sense amplifiers; and
   an isolate device unit coupling said Y-pass gate and Y-decoder unit to said bit lines of said flash memory array.

2. The NAND-based 2T-NOR flash memory device as claimed in claim 1, wherein said slow speed page sense amplifiers, said high speed sense amplifiers, said Y-pass gates and said Y-decoders are made of low voltage devices.

3. The NAND-based 2T-NOR flash memory device as claimed in claim 1, wherein said slow speed page sense amplifiers are used to perform precise threshold voltage verification for pre-program, erase and program operations in a slow speed, low current and page sensing scheme.

4. The NAND-based 2T-NOR flash memory device as claimed in claim 1, wherein said isolate device unit is turned on as a sensing path to said bit lines, said Y-pass gates are decoded by said Y-decoders to connect said byte/word high speed sense amplifier unit to said bit lines, and said data buffer and slow speed page sense amplifier unit is disconnected from said bit lines in a high speed sensing scheme.

5. The NAND-based 2T-NOR flash memory device as claimed in claim 4, wherein said isolate device unit has a gate voltage tied to a boost voltage Vboost to turn on said isolate device unit as a sensing path when a read operation is performed in said high speed sensing scheme.

6. The NAND-based 2T-NOR flash memory device as claimed in claim 1, wherein during a page pre-program operation of a selected memory page in a selected memory block of a selected memory sector, said write-row-decoder connects 20V to the word line of said selected memory page, and 0V to all other word lines in said flash memory array.

7. The NAND-based 2T-NOR flash memory device as claimed in claim 1, wherein during a block pre-program operation of a selected memory block in a selected memory sector, said write-row-decoder connects 20V to the word lines of said selected memory block, and 0V all other word lines in said flash memory array.

8. The NAND-based 2T-NOR flash memory device as claimed in claim 1, wherein during a sector pre-program operation of a selected memory sector, said write-row-decoder connects 20V to all word lines of said selected memory sector, 0V to all other word lines in said flash memory array.

9. The NAND-based 2T-NOR flash memory device as claimed in claim 1, wherein said write-row-decoder is further coupled to the select-gate lines of said flash memory array, and during a pre-program operation of said flash memory array, said read-row-decoder is decoupled from all select-gate lines, and said write-row-decoder connects 20V to all select-gate lines in said flash memory array.

10. The NAND-based 2T-NOR flash memory device as claimed in claim 1, wherein during a page erase operation of a selected memory page in a selected memory block of a selected memory sector, said write-row-decoder connects 0V to the word line of said selected memory page, all other word lines in said selected memory sector are coupled to 20V, and all word lines of all other memory sectors in said flash memory array are applied with 0V.

11. The NAND-based 2T-NOR flash memory device as claimed in claim 1, wherein during a block erase operation of a selected memory block in a selected memory sector, said write-row-decoder connects 0V to the word lines of said selected memory block, all other word lines in said selected memory sector are coupled to 20V, and all word lines of all other memory sectors in said flash memory array are applied with 0V.

12. The NAND-based 2T-NOR flash memory device as claimed in claim 1, wherein during a sector or chip erase operation, said write-row-decoder connects 0V to all word lines of all memory sectors in said flash memory array.

13. The NAND-based 2T-NOR flash memory device as claimed in claim 1, wherein said write-row-decoder is further coupled to the select-gate lines of said flash memory array, and during a page program operation of said flash memory array, said read-row-decoder is decoupled from all select-gate lines of said flash memory array, and said write-row-decoder connects a voltage in a range between 15V and 20V to one of select-gate lines in said flash memory array.

14. The NAND-based 2T-NOR flash memory device as claimed in claim 1, wherein said write-row-decoder is further coupled to the select-gate lines of said flash memory array, and during a chip erase operation of said flash memory array, said read-row-decoder is decoupled from all select-gate lines and said write-row-decoder connects 0V to all select-gate lines of all memory sectors in said flash memory array.

15. The NAND-based 2T-NOR flash memory device as claimed in claim 1, wherein during a page program operation of a selected memory page in a selected memory block of a selected memory sector, said write-row-decoder connects a voltage in a range between 15V and 20V to the word line of said selected memory page, and 5V to all other word lines in said selected memory sector, and all other word lines in said flash memory array are applied with 0V.

16. The NAND-based 2T-NOR flash memory device as claimed in claim 1, wherein said write-row-decoder is further coupled to the select-gate lines of said flash memory array, but during a read operation of said flash memory array, said write-row-decoder is decoupled from all select-gate lines, and said read-row-decoder connects a boost voltage Vboost to one of select-gate lines in said flash memory array.

17. The NAND-based 2T-NOR flash memory device as claimed in claim 1, wherein during a read operation in a selected memory page of a selected memory block in a selected memory sector, said write-row-decoder connects a power supply voltage Vdd or a boost voltage Vboost to all word lines in said selected memory sector, and all other word lines in said flash memory array are applied with 0V.

18. The NAND-based 2T-NOR flash memory device as claimed in claim 1, wherein during a read operation in a selected memory page of a selected memory block in a selected memory sector, said read-row-decoder connects a boost voltage Vboost to the select-gate line of said selected memory page, and all other select-gate lines in said flash memory array are applied with 0V.

19. The NAND-based 2T-NOR flash memory device as claimed in claim 1, wherein each of said NAND-based 2T-NOR flash cells has an access transistor which is a NAND-based double poly transistor having a poly1 floating gate shorted to a poly2 select gate.

20. The NAND-based 2T-NOR flash memory device as claimed in claim 19, wherein during a pre-program operation of said flash memory array, said read-row-decoder connects 0V to all select-gate lines in said flash memory array.

21. The NAND-based 2T-NOR flash memory device as claimed in claim 19, wherein during a page, block or sector erase operation in a selected memory sector, all select-gate lines in said selected memory sector are decoupled from said read-row-decoder so as to be floating and coupled to 20V, and all select-gate lines of all other memory sectors in said flash memory array are applied with 0V.

22. The NAND-based 2T-NOR flash memory device as claimed in claim 19, wherein during a chip erase operation of said flash memory array, all select-gate lines in said flash memory array are decoupled from said read-row-decoder so as to be floating and coupled to 20V.

23. The NAND-based 2T-NOR flash memory device as claimed in claim 19, wherein during a page program operation of a selected memory page in a selected memory block of a selected memory sector, said read-row-decoder connects 5V to all select-gate lines in said selected memory sector, and all select-gate lines of all other memory sectors in said flash memory array are applied with 0V.

24. The NAND-based 2T-NOR flash memory device as claimed in claim 19, wherein during a read operation in a selected memory page of a selected memory block in a selected memory sector, said read-row-decoder connects a boost voltage Vboost to the select-gate line of said selected memory page, and all other select-gate lines in said flash memory array are applied with 0V.

25. The NAND-based 2T-NOR flash memory device as claimed in claim 1, wherein each of said NAND-based 2T-NOR flash cells has an access transistor made of a NAND-based single poly transistor having a poly1 or poly2 select gate.

26. The NAND-based 2T-NOR flash memory device as claimed in claim 25, wherein during a pre-program operation of said flash memory array, said read-row-decoder connects 0V to all select-gate lines in said flash memory array.

27. The NAND-based 2T-NOR flash memory device as claimed in claim 25, wherein during a page, block or sector erase operation in a selected memory sector, all select-gate lines in said selected memory sector are decoupled from said read-row-decoder so as to be floating and coupled to 20V, and all select-gate lines of all other memory sectors in said flash memory array are applied with 0V.

28. The NAND-based 2T-NOR flash memory device as claimed in claim 25, wherein during a chip erase operation of said flash memory array, all select-gate lines in said flash memory array are decoupled from said read-row-decoder so as to be floating and coupled to 20V.

29. The NAND-based 2T-NOR flash memory device as claimed in claim 25, wherein during a page program operation of a selected memory page in a selected memory block of a selected memory sector, said read-row-decoder connects 5V to all select-gate lines in said selected memory sector, and all select-gate lines of all other memory sectors in said flash memory array are applied with 0V.

30. The NAND-based 2T-NOR flash memory device as claimed in claim 25, wherein during a read operation in a selected memory page of a selected memory block in a selected memory sector, said read-row-decoder connects a boost voltage Vboost to the select-gate line of said selected memory page, and all other select-gate lines in said flash memory array are applied with 0V.

* * * * *